(12) United States Patent
Yamazaki et al.

(10) Patent No.: US 8,811,066 B2
(45) Date of Patent: *Aug. 19, 2014

(54) SEMICONDUCTOR MEMORY DEVICE AND DRIVING METHOD THEREOF

(71) Applicant: Semiconductor Energy Laboratory Co., Ltd., Atsugi (JP)

(72) Inventors: Shunpei Yamazaki, Tokyo (JP); Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/790,044

(22) Filed: Mar. 8, 2013

(65) Prior Publication Data
US 2013/0194858 A1    Aug. 1, 2013

Related U.S. Application Data

(63) Continuation of application No. 13/009,034, filed on Jan. 19, 2011, now Pat. No. 8,395,931.

(30) Foreign Application Priority Data

Jan. 22, 2010    (JP) ................................ 2010-012417

(51) Int. Cl.
*G11C 11/24*    (2006.01)
(52) U.S. Cl.
CPC ..................................... *G11C 11/24* (2013.01)
USPC ................................ 365/149; 365/63; 365/72

(58) Field of Classification Search
CPC ................................ G11C 11/24; G11C 11/40
USPC ................................ 365/149, 63, 72, 102, 154
See application file for complete search history.

(56) References Cited

U.S. PATENT DOCUMENTS 3,614,749 A    10/1971    Radcliffe, Jr.
4,466,081 A    8/1984    Masuoka
(Continued)

FOREIGN PATENT DOCUMENTS

EP    1 737 044 A1    12/2006
EP    2 226 847 A2    9/2010
(Continued)

OTHER PUBLICATIONS

International Search Report, PCT Application No. PCT/JP2010/073905, dated Apr. 5, 2011, 5 pages.

(Continued)

*Primary Examiner* — Tan T. Nguyen
(74) *Attorney, Agent, or Firm* — Fish & Richardson P.C.

(57) ABSTRACT

A semiconductor device which stores data by using a transistor whose leakage current between source and drain in an off state is small as a writing transistor. In a matrix including a plurality of memory cells in which a drain of the writing transistor is connected to a gate of a reading transistor and the drain of the writing transistor is connected to one electrode of a capacitor, a gate of the writing transistor is connected to a writing word line; a source of the writing transistor is connected to a writing bit line; and a source and a drain of the reading transistor are connected to a reading bit line and a bias line. In order to reduce the number of wirings, the writing bit line or the bias line is substituted for the reading bit line in another column.

10 Claims, 17 Drawing Sheets

(56) References Cited

U.S. PATENT DOCUMENTS

| | | | |
|---|---|---|---|
| 5,184,324 A * | 2/1993 | Ohta | 365/149 |
| 5,349,366 A | 9/1994 | Yamazaki et al. | |
| 5,459,686 A * | 10/1995 | Saito | 365/149 |
| 5,712,817 A | 1/1998 | Suh | |
| 5,731,856 A | 3/1998 | Kim et al. | |
| 5,744,864 A | 4/1998 | Cillessen et al. | |
| 6,016,268 A | 1/2000 | Worley | |
| 6,094,368 A * | 7/2000 | Ching | 365/49.15 |
| 6,127,702 A | 10/2000 | Yamazaki et al. | |
| 6,294,274 B1 | 9/2001 | Kawazoe et al. | |
| 6,295,226 B1 * | 9/2001 | Yang | 365/185.01 |
| 6,563,174 B2 | 5/2003 | Kawasaki et al. | |
| 6,727,522 B1 | 4/2004 | Kawasaki et al. | |
| 6,804,142 B2 | 10/2004 | Forbes | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,088,606 B2 | 8/2006 | Turner | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,342,825 B2 * | 3/2008 | Takeuchi et al. | 365/185.03 |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,609,546 B2 * | 10/2009 | Rao | 365/168 |
| 7,674,650 B2 | 3/2010 | Akimoto et al. | |
| 7,732,819 B2 | 6/2010 | Akimoto et al. | |
| 7,767,106 B2 | 8/2010 | Chang | |
| 7,816,680 B2 | 10/2010 | Kim et al. | |
| 8,289,753 B2 * | 10/2012 | Yamazaki et al. | 365/149 |
| 8,320,162 B2 * | 11/2012 | Inoue et al. | 365/149 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0002590 A1 | 1/2009 | Kimura | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0097838 A1 | 4/2010 | Tanaka et al. | |
| 2010/0109002 A1 | 5/2010 | Itagaki et al. | |
| 2010/0148171 A1 | 6/2010 | Hayashi et al. | |
| 2010/0193785 A1 | 8/2010 | Kimura | |
| 2011/0101334 A1 | 5/2011 | Yamazaki et al. | |
| 2011/0101339 A1 | 5/2011 | Yamazaki et al. | |
| 2011/0101351 A1 | 5/2011 | Yamazaki | |
| 2011/0122673 A1 | 5/2011 | Kamata et al. | |
| 2011/0134683 A1 | 6/2011 | Yamazaki et al. | |
| 2011/0156028 A1 | 6/2011 | Yamazaki et al. | |
| 2011/0157961 A1 | 6/2011 | Yamazaki et al. | |
| 2011/0175104 A1 | 7/2011 | Yamazaki | |
| 2011/0176348 A1 | 7/2011 | Yamazaki et al. | |
| 2011/0176354 A1 | 7/2011 | Yamazaki et al. | |

FOREIGN PATENT DOCUMENTS

| | | |
|---|---|---|
| EP | 2302685 A | 3/2011 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-044763 A | 2/1990 |
| JP | 05-119298 A | 5/1993 |
| JP | 05-251705 A | 9/1993 |
| JP | 08-264794 A | 10/1996 |
| JP | 08-330445 A | 12/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-093924 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| JP | 2006-165532 A | 6/2006 |
|---|---|---|
| JP | 2008-042067 A | 2/2008 |
| JP | 2009-033145 A | 2/2009 |
| JP | 2009-182194 A | 8/2009 |
| JP | 2011-525041 | 9/2011 |
| WO | 2004/114391 A1 | 12/2004 |
| WO | WO-2009/145581 | 12/2009 |

OTHER PUBLICATIONS

Written Opinion, PCT Application No. PCT/JP2010/073905, dated Apr. 5, 2011, 5 pages.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Tansition: The Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—0 TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects In ZnO," Phys. Rev. B (Physical Review. B), 2007, vol. 76, No. 16, pp. 165202-1-165202-22.

Janotti, A et al., "Oxygen Vacancies In ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFe2O4, and YB2Fe3O7 Types of Structures for Compounds in the In2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06: Proceedings of the 13th International Display Workshops, Dec. 7, 2006, pp. 663-666.

Lee, J et al., "World's Largest (15-inch) XGA AMLCD Panel Using IGZO Oxide TFT," SID Digest '08: SID International Symposium Digest of Technical Papers, May 20, 2008, vol. 39, pp. 625-628.

(56) References Cited

OTHER PUBLICATIONS

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display,"AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2 Development of Driver-Integrated Panel using Amorphous In—Ga—Zn—Oxide TFT," SID Digest '09 : SID International Symposium Digest of Technincal Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure, "IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

SEMICONDUCTOR MEMORY DEVICE AND DRIVING METHOD THEREOF

CROSS-REFERENCE TO RELATED APPLICATIONS

This application is a continuation of U.S. application Ser. No. 13/009,034, filed Jan. 19, 2011, now allowed, which claims the benefit of a foreign priority application filed in Japan as Serial No. 2010-012417 on Jan. 22, 2010, both of which are incorporated by reference.

TECHNICAL FIELD

The present invention relates to a memory device using a semiconductor.

BACKGROUND ART

There are many kinds of memory devices using semiconductors. For example, a dynamic random access memory (DRAM), a static random access memory (SRAM), an electrically erasable and programmable read only memory (EEPROM), a flash memory, and the like can be given.

In a DRAM, data is stored by holding charge in a capacitor which is provided in a memory cell. However, even when a transistor used for switching is in an off state, a slight amount of leakage current is generated between a source and a drain; thus, the data is lost within a relatively short time (several tens of seconds at the longest). Therefore, the data needs to be rewritten (refreshed) in a certain cycle (generally several tens of milliseconds).

In an SRAM, data is held by utilizing a bistable state of a flip-flop circuit. Although a CMOS inverter is generally used in a flip-flop circuit of an SRAM, since six transistors are used in one memory cell, an integration degree of the SRAM is lower than an integration degree of a DRAM. In addition, the data is lost when power is not supplied.

On the other hand, in an EEPROM or a flash memory, a so-called floating gate is provided between a channel and a gate and charge is stored in the floating gate, whereby data is held. The charge stored in the floating gate is held even after power supply to a transistor stops, which is why these memories are called non-volatile memories. Patent Document 1, for example, can be referred to for description of a flash memory. These memories are hereinafter called floating gate non-volatile memories (FGNVM), in particular.

Since data at some stages (multivalued data) can be stored in one memory cell in an FGNVM, storage capacity can be large. Further, since the number of contact holes can be significantly decreased in a NAND-type flash memory, an integration degree can be increased to some extent.

However, in a conventional FGNVM, high voltage is needed at the time of injection of charge to a floating gate or removal of the charge. Because of this, deterioration of a gate insulating film cannot be avoided and writing and erasing cannot be repeated without limitation. Further, by application of high voltage, interference between adjacent memory cells occurs when a certain integration degree (a line width of 50 nm or less) is achieved; therefore, a certain distance needs to be kept between the memory cells.

REFERENCE

Patent Document

[Patent Document 1] Japanese Published Patent Application No. S57-105889

DISCLOSURE OF INVENTION

As described above, a conventional semiconductor memory device has good points and bad points. A semiconductor memory device in which data can be held for one day or longer, preferably one year or longer, more preferably ten years or longer even after power supply is turned off is desired. In addition, there is preferably no limitation on the number of times of writing and it is desirable that writing can be performed one billion times or more.

Furthermore, an integration degree is also important. When a minimum line width is F, an area occupied by one memory cell is 100 $F^2$ to 150 $F^2$ in a conventional SRAM, 8 $F^2$ in a conventional DRAM, 4 $F^2$ to 6 $F^2$ in a conventional NAND-type flash memory, and 6 $F^2$ to 12 $F^2$ in a conventional NOR-type flash memory; however, it is desirable that the area be 40 $F^2$ or less, preferably 10 $F^2$ or less, more preferably 5 $F^2$ or less.

From the above aspects, a DRAM or an SRAM is not preferable because data is lost when power supply is turned off; as for the SRAM, the integration degree needed is not achieved. Although an FGNVM has an advantage that data is held at least for ten years after power supply is turned off, the number of times of writing is a hundred thousand or less.

In view of the above, it is an object of an embodiment of the present invention to provide a semiconductor memory device in which all the following three conditions are met: data can be held for one hour or longer, preferably one day or longer, more preferably ten years or longer; the number of times of writing can be one million or more; and an integration degree is 40 $F^2$ or less, preferably 10 $F^2$ or less, more preferably 5 $F^2$ or less. Note that in this specification, a data holding time is a time needed for the amount of charge held in a memory cell to be decreased to 90% of the initial amount.

Further, it is an object of an embodiment of the present invention to provide a memory device having a novel structure and a driving method thereof. In particular, it is an object of an embodiment of the present invention to provide a memory device in which power consumption can be reduced and a driving method in which power consumption can be reduced.

The present invention will be described below; terms used in this specification are briefly described. First of all, names of a source and a drain of a transistor are usually determined depending on potential applied; however, in this specification, when one of them is called a source, the other is called a drain for convenience and they are not particularly distinguished. Therefore, a source in this specification can be alternatively referred to as a drain.

In the first structure of the present invention, one memory cell includes a transistor as a writing transistor, in which leakage current between a source and a drain is small, another transistor (a reading transistor), and a capacitor, and a plurality of the memory cells is arranged in a matrix. Further, as wirings connected to these, five kinds of wirings that are a writing word line, a writing bit line, a reading word line, a reading bit line, and a bias line are prepared.

The drain of the writing transistor is connected to a gate of the reading transistor and one electrode of the capacitor. Further, a gate of the writing transistor is connected to the writing word line; the source of the writing transistor is connected to the writing bit line; a source of the reading transistor is connected to the reading bit line; a drain of the reading transistor is connected to the bias line; and the other electrode of the capacitor is connected to the reading word line.

In the writing transistor in an off state, leakage current between the source and the drain is preferably $1 \times 10^{-20}$ A or smaller, more preferably 1×10⁻²¹ A or smaller at a temperature where the transistor is in use (e.g., 25° C.), or 1×10⁻²⁰ A or smaller at 85° C. In the case of a general silicon semiconductor, it is difficult to realize leakage current having such a small value; however, in a transistor obtained by processing a semiconductor whose band gap is 3 electron volts or more, particularly an oxide semiconductor in a preferable condition, such a value can be achieved. Therefore, an oxide semiconductor is preferably used for the writing transistor. Needless to say, if leakage current can be made to have a value smaller than or equal to the above-described value by another method with the use of a silicon semiconductor or other kinds of semiconductors, the use of such semiconductors is not precluded.

Although a variety of known materials can be used as the oxide semiconductor, a material with a band gap greater than or equal to 3 electron volts and less than 3.6 electron volts is desirable. In addition, it is desirable to use a material whose electron affinity is 4 electron volts or more, more preferably greater than or equal to 4 electron volts and less than 4.9 electron volts. Among such materials, one whose carrier concentration is less than $1\times10^{14}$ cm⁻³, preferably less than $1\times10^{11}$ cm⁻³ may be used. The present inventors found that semiconductor characteristics which are exhibited by an oxide semiconductor meeting such conditions hardly differ from those observed at room temperature even at 150° C., for example.

As for the reading transistor, although there is no limitation on leakage current between the source and the drain in an off state, it is desirable to use a transistor which operates at high speed in order to increase the reading rate. It is preferable to use a transistor with switching speed of 10 nanoseconds or less. Further, in both the writing transistor and the reading transistor, gate leakage current (leakage current between the gate and the source or between the gate and the drain) needs to be extremely small; also in the capacitor, internal leakage current (leakage current between the electrodes) needs to be small. Each leakage current is preferably 1×10⁻²⁰ A or smaller, more preferably 1×10⁻²¹ A or smaller at a temperature where the transistor or capacitor is in use (e.g., 25° C.).

Unlike the case of an FGNVM, there is no particular limitation on the capacity of the capacitor; however, since an integration degree is decreased as the size of the capacitor is increased, the area of the capacitor is greater than or equal to one tenth and less than 2 times that of a channel region of the reading transistor (a channel width×a channel length, in the case where the channel region is rectangular), preferably greater than or equal to one tenth of that of the channel region of the reading transistor and less than that of the channel region of the reading transistor. The area of the capacitor is preferably 100 nm² to 0.01 μm².

As a dielectric of the capacitor, a material such as hafnium oxide, lanthanum oxide, yttrium oxide, or aluminum oxide is used as needed and the relative permittivity may be 10 or more, preferably 15 or more. The capacity of the capacitor is preferably 10 fF or smaller so that the semiconductor memory device operates at high speed.

The writing word line, the writing bit line, the reading bit line, the bias line, and the reading word line are arranged in a matrix; the writing word line is preferably orthogonal to the writing bit line and the reading bit line is preferably parallel to the bias line so that matrix drive is performed. In addition, the writing word line is preferably parallel to the reading word line.

A memory cell having the above-described structure is illustrated in FIG. 1A. Here, a memory cell in the n-th row and the m-th column is described as an example. In FIG. 1A, a memory cell including a writing transistor Tr1(n,m), a reading transistor Tr2(n,m), and a capacitor C(n,m) is illustrated. Here, a drain of the writing transistor Tr1(n,m) is connected to a gate of the reading transistor Tr2(n,m) and one electrode of the capacitor C(n,m).

Further, a gate of the writing transistor Tr1(n,m) is connected to a writing word line Qn; a source of the writing transistor Tr1(n,m) is connected to a writing bit line Rm; a source of the reading transistor Tr2(n,m) is connected to a reading bit line Om; a drain of the reading transistor Tr2(n,m) is connected to a bias line Sm; and the other electrode of the capacitor C(n,m) is connected to a reading word line Pn.

In FIG. 1A, the writing word line Qn is parallel to the reading word line Pn and the writing bit line Rm, the reading bit line Om, and the bias line Sm are parallel to one another. Further, the writing word line Qn and the reading word line Pn are orthogonal to the writing bit line Rm, the reading bit line Om, and the bias line Sm.

In FIG. 1B, the memory cell in the n-th row and the m-th column and a portion around the memory cell are illustrated. As apparent from the diagram, two wirings per row and three wirings per column are needed; thus, (2N+3M) wirings are needed in a matrix of N rows and M columns.

In order that data be written in the memory cell illustrated in FIG. 1A, the writing transistor Tr1(n,m) is turned on by applying appropriate potential to the writing word line Qn. By the potential of the writing bit line Rm at this time, charge is injected to the drain side of the writing transistor Tr1(n,m). The amount of the charge injected at this time is determined depending on the potential of the writing bit line Rm, the gate capacitance of the reading transistor Tr2(n,m), the capacity of the capacitor C(n,m), and the like and the result is thus always almost the same in the case where the conditions are the same, and variation is small. In this manner, data is written.

Then, by applying different appropriate potential to the writing word line Qn, the writing transistor Tr1(n,m) is turned off. Leakage current in the writing transistor Tr1(n,m) in an off state is 1×10⁻²⁰ A or smaller, whereby charge on the drain side of the writing transistor Tr1(n,m) is held as it is for an extremely long time.

When the data is read, appropriate potential is applied to the reading word line Pn and a state of the reading transistor Tr2(n,m) is monitored. For example, there are assumed to be two states as data that are a state where there is no charge on the drain side of the writing transistor Tr1(n,m) and a state where there is positive charge on the drain side of the writing transistor Tr1(n,m). It is also assumed that the reading transistor Tr2(n,m) is an n-channel transistor; the bias line Sm is held at appropriate positive potential; and appropriate potential lower than or equal to the threshold value of the reading transistor Tr2(n,m) is applied to the reading word line Pn.

In the state where there is no charge, since the potential of the gate of the reading transistor Tr2(n,m) is lower than or equal to the threshold value, the reading transistor Tr2(n,m) is in an off state and resistance between the source and the drain is extremely high. Therefore, the potential of the reading bit line Om is largely different from the potential of the bias line Sm. However, when there is positive charge on the drain side of the writing transistor Tr1(n,m), the reading transistor Tr2(n,m) can be turned on in some cases even when the potential of the reading word line Pn is lower than or equal to the threshold value; accordingly, the potential of the reading bit line Om is the same as or extremely close to the potential of the bias line Sm in some cases. In this manner, what data is held can be known.

With the use of the same principle, a stage to which the amount of the charge stored in 1 memory cell corresponds can be known. A circuit at the time of reading is equivalently illustrated in FIG. 4A. By changing the potential of the writing bit line Rm at the time of writing, a value of charge Q on the drain side of the writing transistor Tr1 is at four stages (Q0, Q1, Q2, and Q3, where Q0<Q1<Q2<Q3, and Q0 is 0 or more). At the time of reading, the writing transistor Tr1($n,m$) can be regarded as an insulator and thus is omitted together with the writing word line Qn and the writing bit line Rm from the diagram.

In accordance with the value of the charge Q, apparent characteristics of the reading transistor Tr2($n,m$) are changed. When the potential of the reading bit line Om is 0, the potential of the bias line Sm is $V_{SH}$ (>0), and the potential of the reading word line Pn is changed, the amount of current flowing in the reading transistor Tr2($n,m$) is changed. The state is illustrated in FIG. 4B.

In the case where the largest amount of charge is held (Q=Q3), even when $V_g$ is negative, a sufficiently large amount of current flows and the reading transistor Tr2 is turned on. For example, the reading transistor Tr2 is turned on when $V_g=V_{P1}$. In order to turn the reading transistor Tr2 off, $V_g$ needs to be a sufficiently large negative value (e.g., $V_{PL}$). The second curve from the left shows a case where the amount of charge is the second largest (Q=Q2). At this time, the reading transistor Tr2 is turned on when $V_g=V_{P2}$. On the other hand, the reading transistor Tr2 is in an off state when $V_g=V_{P1}$. In the case where the amount of charge is the third largest (Q=Q1), the reading transistor Tr2 is in an off state when $V_g=V_{P2}$ but turned on when $V_g=V_{P3}$. In the case where Q=Q0, the reading transistor Tr2 is in an off state even when $V_g=V_{P3}$.

That is, by applying potential at some levels to the reading word line Pn, the amount of the charge held can be known. At first, $V_g=V_{PL}$. In this case, the reading transistor Tr2 is in an off state regardless of the amount of the charge held. Then, when $V_g=V_{P1}$, the reading transistor Tr2 is turned on only when the amount of the charge held is Q3. If the reading transistor Tr2 is turned on at this stage, it can be judged that the amount of the charge held is Q3.

When $V_g=V_{P2}$, the reading transistor Tr2 is turned on only when the amount of the charge held is Q3 or Q2. If the reading transistor Tr2 is turned on for the first time at this stage, it can be judged that the amount of the charge held is Q2.

When $V_g=V_{P3}$, the reading transistor Tr2 is turned on only when the amount of the charge held is Q3, Q2, or Q1. If the reading transistor Tr2 is turned on for the first time at this stage, it can be judged that the amount of the charge held is Q1. If the reading transistor Tr2 is not turned on even at this stage, it can be judged that the amount of the charge is Q0. In this manner, the data (2 bits) at four stages can be written and read. Needless to say, in a similar manner, much more data such as data (3 bits) at eight stages or data (4 bits) at 16 stages can be written and read.

As described above, in order that much data be stored by making the amount of the charge held in the memory cell be at a plurality of stages, it is necessary that a variation in the amount of the charge held is small. This is because when the variation in the amount of the charge is large, each gap between $V_{PL}$, $V_{P1}$, $V_{P2}$, and $V_{P3}$ in FIG. 4B needs to be made larger. The matrix type semiconductor memory device according to the first structure of the present invention is suitable for this purpose because a variation in the amount of the charge held is small.

Further, in an FGNVM, extremely high voltage needs to be applied to a transistor at the time of writing or erasing; on the other hand, according to an embodiment of the present invention, voltage applied to a transistor can be lower both at the time of writing and at the time of reading. Thus, the capacity of the capacitor and the gate capacitance of the reading transistor do not restrict each other so much.

In general, when the capacity of a capacitor is larger than the gate capacitance of a reading transistor, much of voltage applied to a bias line and a reading word line is applied to a gate of the reading transistor, and voltage applied to the gate of the reading transistor is thus high. Therefore, data can be read with lower voltage.

On the other hand, when the capacity of the capacitor is smaller than the gate capacitance of the reading transistor, much of the voltage applied to the bias line and the reading word line is applied to the capacitor, much of voltage applied between the bias line and the reading word line is applied to the capacitor, and the voltage applied to the gate of the reading transistor is thus low. Therefore, data cannot be read unless higher voltage is applied between the reading word line and the bias line.

However, in an embodiment of the present invention, absolute voltage needed for a transistor both at the time of writing and at the time of reading is much lower when compared with that needed in the case of an FGNVM. The absolute voltage is typically 0.5 volts to 3 volts; even if the capacity of the capacitor is one third of the gate capacitance of the reading transistor, voltage applied to the memory cell is 9 volts at the highest. In addition, such voltage is not directly applied to a gate insulating film of the transistor. Thus, the transistor is not deteriorated by high voltage.

This makes an embodiment of the present invention definitely different from a conventional FGNVM. As an example of a conventional FGNVM, a memory cell of a NAND-type flash memory is described with reference to FIGS. 13A to 13D. FIG. 13A is a top view of a memory cell in the n-th row and the m-th column and a portion around the memory cell. Over a semiconductor wafer on which an element separation region 151 is formed, a floating gate 153 and a control gate 154 are stacked and an impurity region 152 is provided over the semiconductor wafer.

The control gates 154 serve as word lines ( . . . , Wm−1, Wm, Wm+1, . . . ). Further, although the impurity regions are separated in part with which the floating gate 153 overlaps, the impurity regions are connected to bit lines ( . . . , Bm−1, Bm, Bm+1, . . . ) at the time of operation.

FIG. 13B is a cross-sectional view taken along a straight line linking dot X1 to dot X2 in FIG. 13A. Over a semiconductor wafer 150, the floating gate 153 and the control gate 154 are stacked and further, the impurity region 152 is provided in such a manner that edges of the impurity region 152 are aligned with edges of the floating gate 153 and the control gate 154. An insulating film 155 and an insulating film 156 are provided between the semiconductor wafer 150 and the floating gate 153 and between the floating gate 153 and the control gate 154, respectively.

FIG. 13C is a cross-sectional view taken along a straight line linking dot Y1 to dot Y2 in FIG. 13A. Over the semiconductor wafer 150, the element separation region 151 is provided and the floating gate 153 and the control gate 154 are stacked thereover. The insulating film 155 and the insulating film 156 are provided between the semiconductor wafer 150 and the floating gate 153 and between the floating gate 153 and the control gate 154, respectively.

Such a memory cell can be expressed by a circuit illustrated in FIG. 13D. That is, a capacitor C1 which is formed using the floating gate 153 and the semiconductor wafer 150 with the insulating film 155 therebetween as a dielectric, and a capacitor C2 which is formed using the floating gate 153 and the control gate 154 with the insulating film 156 therebetween as a dielectric are connected in series.

By the way, in such a memory cell of an FGNVM, C1 needs to be much smaller than C2. This is because high voltage (10 volts or higher) needs to be applied between the semiconductor wafer 150 (or the impurity region 152) and the floating gate 153 at the time of writing or at the time of erasing data.

If C1=C2, voltage as high as 20 volts needs to be applied between the control gate 154 and the semiconductor wafer 150 (or the impurity region 152) in order that voltage between the semiconductor wafer 150 (or the impurity region 152) and the floating gate 153 be 10 volts.

Therefore, in an FGNVM, it is desirable that the size of C1 be less than or equal to one-half of that of C2. However, when C2 is made larger than C1 as described above, the shape of the memory cell is limited. As illustrated in FIG. 13C, an area S1 which the capacitor C1 needs is (a channel width×a channel length) of the transistor of the memory cell and is almost determined by the minimum line width.

On the other hand, an area S2 of the capacitor C2 is roughly the same as a surface area of a top surface of the floating gate 153. Thus, the capacitor C2 can be made sufficiently large only by making the floating gate 153 excessively large. From the above reason, in a conventional FGNVM, the area of a memory cell is excessively large.

Since there is no such limitation in an embodiment of the present invention, the position of the capacitor can be decided more freely, an area per memory cell can be smaller, and the integration degree of the semiconductor memory device can be further increased.

In the second structure of the present invention, the writing bit line is substituted for the reading bit line in the above-described first structure of the present invention. A memory cell having such a structure is illustrated in FIG. 5A. Here, a memory cell in the n-th row and the m-th column is described as an example. In FIG. 5A, the memory cell including the writing transistor Tr1($n,m$), the reading transistor Tr2($n,m$), and the capacitor C(n,m) is illustrated. The drain of the writing transistor Tr1($n,m$) is connected to the gate of the reading transistor Tr2($n,m$) and one electrode of the capacitor C(n,m).

Further, the gate of the writing transistor Tr1($n,m$) is connected to the writing word line Qn; the source of the writing transistor Tr1($n,m$) is connected to the writing bit line Rm; the source of the reading transistor Tr2($n,m$) is also connected to the writing bit line Rm; the drain of the reading transistor Tr2($n,m$) is connected to the bias line Sm; and the other electrode of the capacitor C(n,m) is connected to the reading word line Pn.

In FIG. 5B, the memory cell in the n-th row and the m-th column and a portion around the memory cell are illustrated. As apparent from the diagram, two wirings per row and two wirings per column are needed; thus, (2N+2M) wirings are needed in a matrix of N rows and M columns. The writing bit line is substituted for the reading bit line of the first structure of the present invention, whereby the number of wirings can be made smaller than that of the first structure of the present invention.

In the third structure of the present invention, a bias line is substituted for the reading bit line in another column of the above-described first structure of the present invention. A memory cell having such a structure is illustrated in FIG. 14A. Here, a memory cell in the n-th row and the m-th column is described as an example. In FIG. 14A, the memory cell including the writing transistor Tr1($n,m$), the reading transistor Tr2($n,m$), and the capacitor C(n,m) is illustrated. The drain of the writing transistor Tr1($n,m$) is connected to the gate of the reading transistor Tr2($n,m$) and one electrode of the capacitor C(n,m).

Further, the gate of the writing transistor Tr1($n,m$) is connected to the writing word line Qn; the source of the writing transistor Tr1($n,m$) is connected to the writing bit line Rm; the source of the reading transistor Tr2($n,m$) is connected to a bias line Sm−1 in an adjacent column; the drain of the reading transistor Tr2($n,m$) is connected to the bias line Sm; and the other electrode of the capacitor C(n,m) is connected to the reading word line Pn.

In FIG. 14B, the memory cell in the n-th row and the m-th column and a portion around the memory cell are illustrated. As apparent from the diagram, two wirings per row, two wirings per column, and one bias line in the first column are needed; thus, (2N+2M+1) wirings are needed in a matrix of N rows and M columns. The bias line is substituted for the reading bit line in another column of the first structure of the present invention, whereby the number of wirings can be made smaller than that of the first structure of the present invention.

Although the three structures are described above as means for achieving the objects, a different solution is also disclosed in this specification. Further, the objects can be achieved also by making modifications obvious to those skilled in the art to the above three structures or any means for achieving the objects which is disclosed in this specification. Therefore, means for achieving the objects are not limited to the above three structures.

By employing any of the above-described structures, at least one of the above-described objects can be achieved. In each of the above structures, since the writing operation is performed by ordinarily turning a transistor on or off, the problem of deterioration of an insulating film, from which an FGNVM suffers, cannot occur. Therefore, the number of times of writing in above-describe structures can be much larger than that in an FGNVM. By optimizing conditions, even after performing writing a billion times, change in main characteristics of a transistor (threshold voltage, on state current, and an S value) which is measured is in the range of measurement error or is only less than 1%.

In addition, charge can be held for one hour or longer, preferably one day or longer by making leakage current between a source and a drain of a transistor in an off state which is used, gate leakage current in the transistor which is used, and internal leakage current in the capacitor meet the above-described conditions. Moreover, by using preferable conditions, charge can be held for one year or longer, or ten years or longer.

In the case where the charge is reduced due to the leakage current, refreshing may be performed similarly to a conventional DRAM; an interval between refreshing operations is determined depending on a period during which the charge can be held. In the case where the charge is held for such a long period, refreshing is necessary, for example, only once a month or once a year. Frequent refreshing which is needed in a conventional DRAM is not necessary and thus power consumption of a semiconductor memory device is reduced.

Note that in a conventional DRAM, operation of writing data is needed again every time when the data is read; on the other hand, in a semiconductor memory device according to an embodiment of the present invention, such operation is unnecessary because data is not lost by operation of reading the data. Such a feature can be conventionally realized in an SRAM; however, in the semiconductor memory device according to an embodiment of the present invention, the number of transistors used in 1 memory cell is 5 or less, typically 2, which is smaller than that in the case of a conventional SRAM. Furthermore, when one of the transistors is formed using an oxide semiconductor in a thin film shape, an increased integration degree can be obtained because the transistor can be stacked over a conventional silicon semiconductor.

The integration degree can be increased by decreasing the area of the capacitor because there is no limitation on the size of the memory cell in an embodiment of the present invention as described above, unlike the case of a conventional FGNVM.

Further, in a semiconductor memory device having the above-described structure, high voltage, which is needed for writing and erasing in an FGNVM, is not needed. In a so-called flash memory that is one of FGNVMs, in order that data in even one memory cell be rewritten, data in a predetermined region needs to be collectively erased with the use of high voltage. In this point, in the semiconductor memory device according to an embodiment of the present invention, rewriting is performed per row and thus completes through the minimum necessary operation.

Further, since charge is injected to the floating gate in one direction in a thermal non-equilibrium state in an FGNVM, a variation in the amount of charge is large. Data at a plurality of stages which depends on the amount of the charge held in the floating gate can be stored. However, when the variation in the amount of the charge is considered, data at around four stages (2 bits) is general. Higher voltage needs to be used in order that data of a larger number of bits be stored.

On the other hand, charge is reversibly injected in an embodiment of the present invention and thus variation is small; for example, a variation in the threshold value of the reading transistor due to injection of charge can be 0.5 volts or smaller. Thus, data at more stages can be held in one memory cell within a narrower voltage range; consequently, voltage for writing or reading can be lower. For example, voltage used for writing or reading data of 4 bits (16 stages) can be 10 volts or lower.

Since voltage used is relatively low in an embodiment of the present invention, a phenomenon such as interference with an adjacent element or leakage of a signal to an adjacent element is less likely to occur than in an FGNVM, and in addition, the length of one side of one memory cell can be as small as 10 nm in simulation.

In order to further increase such an effect of the present invention, an S value of a transistor used may be greater than or equal to 59 mV/dec and less than or equal to 70 mV/dec, preferably greater than or equal to 59 mV/dec and less than or equal to 63 mV/dec at a temperature where the transistor is in use. In this manner, a variation in threshold values in the whole semiconductor memory device can be reduced, which is a matter of course. In particular, when the writing transistor has an S value in the above range, a variation in the amount of charge at the time of writing data becomes small. In addition, when the reading transistor has an S value in the above range, potential to be applied to the reading word line at the time of reading can be set minutely. These features are advantageous in the case of dealing with multivalued data in a semiconductor memory device.

BEST MODE FOR CARRYING OUT THE INVENTION

Figure 1A:
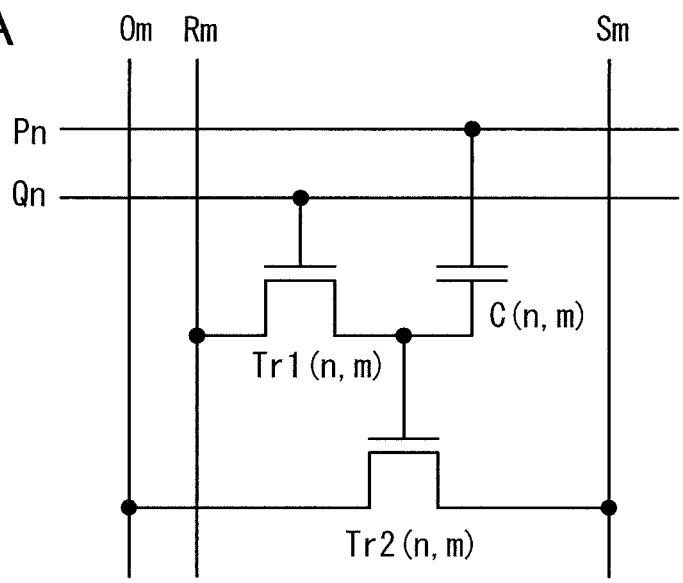
FIGS. 1A and 1B are diagrams illustrating an example of a semiconductor memory device according to an embodiment of the present invention.

Hereinafter, embodiments will be described with reference to drawings. However, the embodiments can be implemented in various modes. It will be readily appreciated by those skilled in the art that modes and details can be changed in various ways without departing from the spirit and scope of the present invention. Therefore, this invention is not interpreted as being limited to the description of the embodiments below. Note that in structures of the invention described below, the same portions or portions having similar functions are denoted by the same reference numerals, and description thereof is not repeated.

Further, in the embodiments described below, for easy understanding, timing, width, height, or the like of a pulse is explained to have a fixed value; however, in consideration of the spirit of the present invention, it can be easily understood that the timing of the pulse is not necessarily synchronized or the width or height of the pulse is not necessarily fixed.

Embodiment 1

Figure 1B:
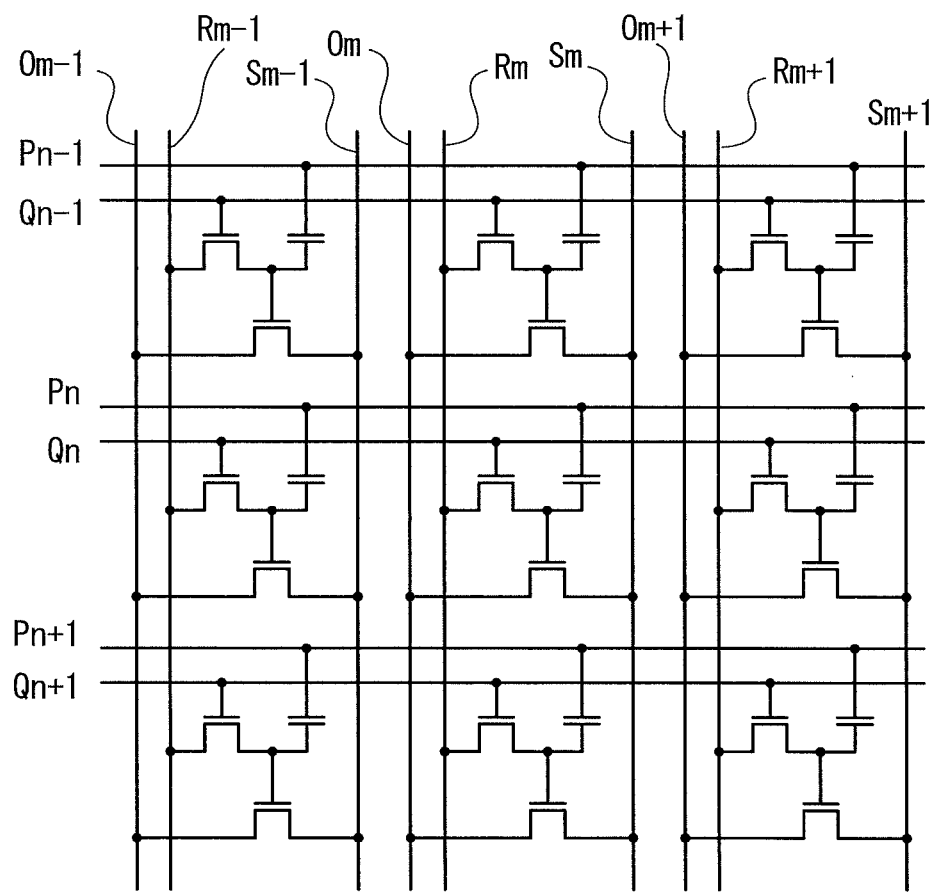

In this embodiment, operation of a semiconductor memory circuit illustrated in FIGS. 1A and 1B is described. Here, both the writing transistor Tr1 and the reading transistor Tr2 are n-channel transistors. First, a writing method is described with reference to FIGS. 2A and 2B. At the time of writing, the reading bit lines (..., Om−1, Om, Om+1, ...), the bias lines (..., Sm−1, Sm, Sm+1, ...), and the reading word lines (..., Pn−1, Pn, Pn+1, ...) are held at constant potential. Although potential may be different depending on the kind of a wiring, the potential of any wiring is set to 0 volt here.

Figure 2A:
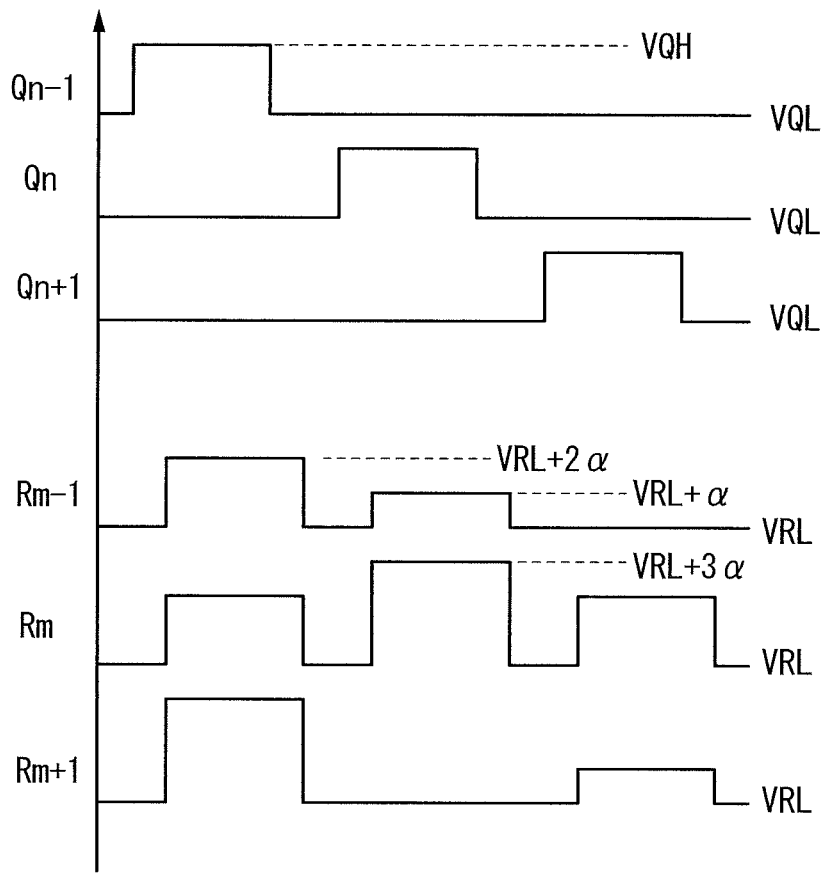
FIGS. 2A and 2B are diagrams illustrating a driving method (writing) of a semiconductor memory device according to Embodiment 1.

In this state, a pulse is sequentially applied to the writing word lines (..., Qn−1, Qn, Qn+1, ...) so that the writing transistor is turned on/off. Here, the potential of the writing word line when the pulse is not applied is $V_{QL}$ and potential of the pulse is $V_{QH}$. As illustrated in FIG. 2A, by sequentially applying the pulse in each row, the writing transistor is turned on/off per row. A time for which the pulse continues may be determined in consideration of the characteristics of the writing transistor.

Although periods during which the pulse is applied are prevented from overlapping with each other in the diagram, for example, a period during which a pulse is applied to Qn−1 may partly overlap with a period during which a pulse is applied to Qn. In addition, $V_{QL}$ needs to be lower than or equal to the threshold value of the writing transistor Tr1 and can be set to −2 volts, for example. Further, $V_{QH}$ needs to be higher than or equal to the threshold value of the writing transistor Tr1 and can be set to +2 volts, for example.

At the same time, a signal is applied to the writing bit lines (..., Rm−1, Rm, Rm+1, ...). The signal applied to the writing bit lines includes a plurality of pulses and the height of the pulses can be various. Here, the pulses have four levels of height $V_{RL}$, $V_{RL+\alpha}$, $V_{RL+2\alpha}$, and $V_{RL+3\alpha}$ ($\alpha>0$). The pulse is not completely synchronized with the pulse to the writing word line but is preferably applied after a predetermined period ($\tau_1$) after the pulse to the writing word line is applied, and preferably stopped being applied after a predetermined period ($\tau_2$) after the pulse to the writing word line is stopped being applied. Here, $\tau_1$ and $\tau_2$ may be set so that $\tau_1<\tau_2$ or $\tau_1>\tau_2$; however, for design of a circuit, it is preferable that they are set so that $\tau_1=\tau_2$.

Figure 2B:
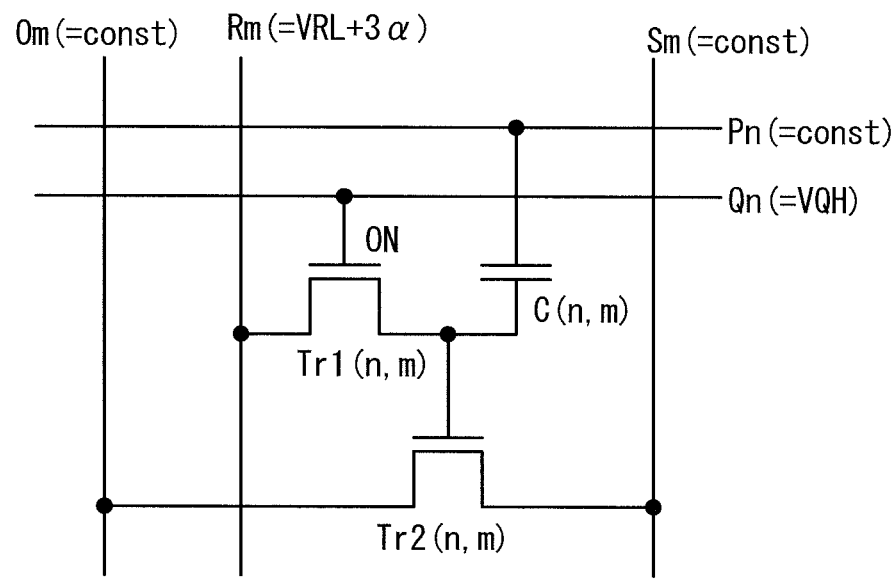

A state of the memory cell in the n-th row and the m-th column is illustrated in FIG. 2B. Here, the potential of the writing word line Qn is $V_{QH}$ and the writing transistor Tr1(n, m) is thus in an on state. Therefore, the drain of the writing transistor Tr1(n,m) (i.e., the gate of the reading transistor Tr2(n,m)) is at the potential $V_{RL+3\alpha}$ of the writing bit line Rm at the time or at potential close to this potential.

In this manner, potential in each memory cell is determined. Based on the potential in each memory cell, the amount of charge generated on the drain side of each of the writing transistors Tr1 is determined. Here, the amount of charge in each of the memory cells is shown in Table 1 when the amount of charge corresponding to the potential $V_{RL}$ is Q0, that corresponding to the potential $V_{RL+\alpha}$ is Q1, that corresponding to the potential $V_{RL+2\alpha}$ is Q2, and that corresponding to the potential $V_{RL+3\alpha}$ is Q3.

TABLE 1

|  | (m − 1)th column | (m)th clolumn | (m + 1)th column |
|---|---|---|---|
| (n − 1)th row | Q2 | Q2 | Q3 |
| (n)th row | Q1 | Q3 | Q0 |
| (n + 1)th row | Q0 | Q2 | Q1 |

Figure 4A:
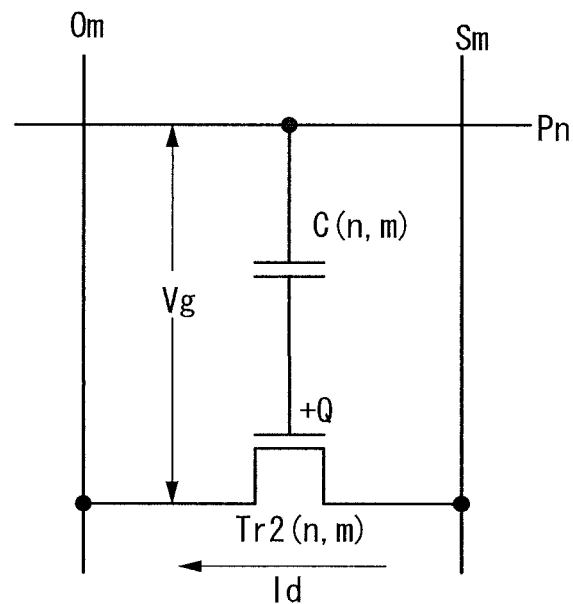
FIGS. 4A and 4B are diagrams illustrating a principle of reading data at a plurality of stages according to an embodiment of the present invention.
Figure 4B:
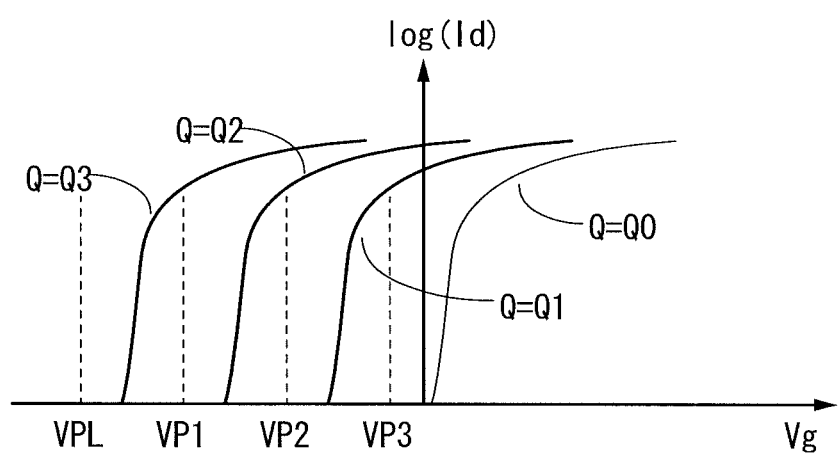

The amount of charge Q0, the amount of charge Q1, the amount of charge Q2, and the amount of charge Q3 correspond to those already described with reference to FIG. 4B. The above charge can be held for a very long time (ten hours or longer) by appropriately holding the potential of the writing word line.

Next, a reading method is described with reference to FIGS. 3A and 3B. As illustrated in FIG. 3B, at the time of reading, constant potential is applied to the writing word lines (..., Qn−1, Qn, Qn+1, ...) and the writing bit lines (..., Rm−1, Rm, Rm+1, ...). It is necessary to apply potential lower than or equal to the threshold value of the writing transistor to the writing word lines. Although the potential of the writing word line is held at $V_{QL}$ and the potential of the writing bit line is held at $V_{RL}$ here, the lines may be held at another potential. Further, the bias lines (..., Sm−1, Sm, Sm+1, ...) are also held at constant potential $V_{SH}$. The potential $V_{SH}$ can be set to, for example, +1 volt. In addition, a load (a resistor) with an appropriate magnitude is connected to an end of the reading bit lines (..., Om−1, Om, Om+1, ...) and an end of the load is held at constant potential (0 V here).

The potential of the reading word lines is held at $V_{PL}$ except when a pulse is applied. Then, as illustrated in FIG. 3A, pulses are sequentially applied to the reading word lines (..., Pn−1, Pn, Pn+1, ...). First, the height of the pulse at first is $V_{P1}$ and the pulse is applied to all the rows; then, a pulse at a height of $V_{P2}$ is sequentially applied to the reading word lines. Then, a pulse at a height of $V_{P3}$ is sequentially applied to the reading word lines. In this manner, reading is performed. In the above description, $V_{PL}$, $V_{P1}$, $V_{P2}$, and $V_{P3}$ correspond to those already described with reference to FIG. 4B.

Through the above steps, the reading transistor Tr2 is turned on in some cases by the application of the pulse. For example, as already described with reference to FIG. 4B, it is the reading transistor Tr2 of a memory cell in which the amount of charge is Q3 that is turned on with the pulse at the height of $V_1$, which is the lowest; therefore, which of the memory cells has the amount of charge Q3 can be specified by observing the potential of the reading bit lines (..., Om−1, Om, Om+1, ...). This is because when the reading transistor Tr2 is turned on, the potential of the reading bit line becomes close to the potential of the bias line.

Figure 3A:
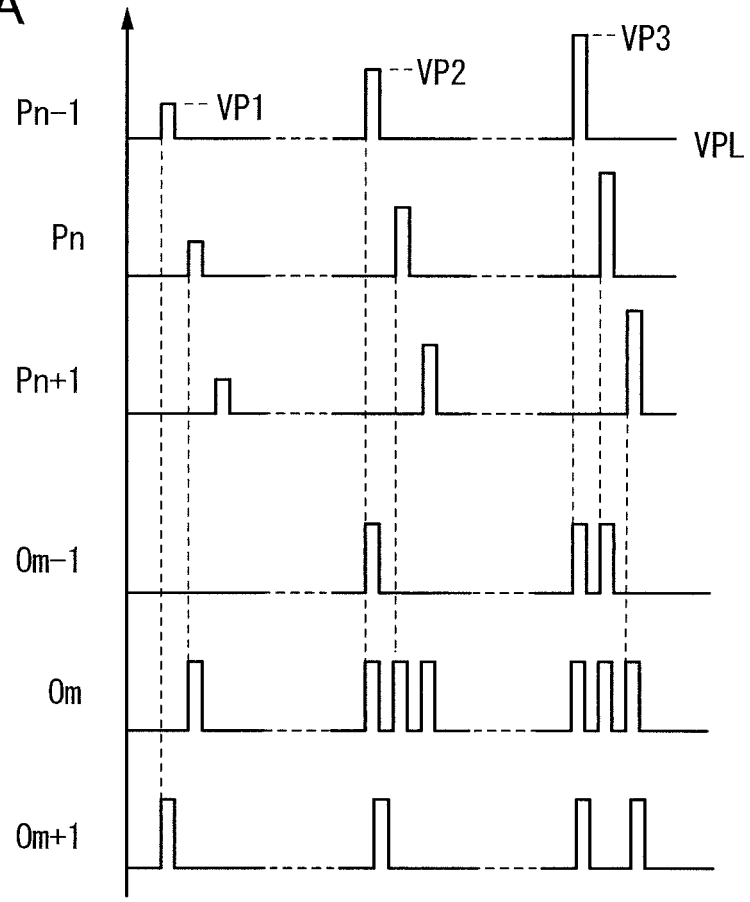
FIGS. 3A and 3B are diagrams illustrating a driving method (reading) of the semiconductor memory device according to Embodiment 1.
Figure 3B:
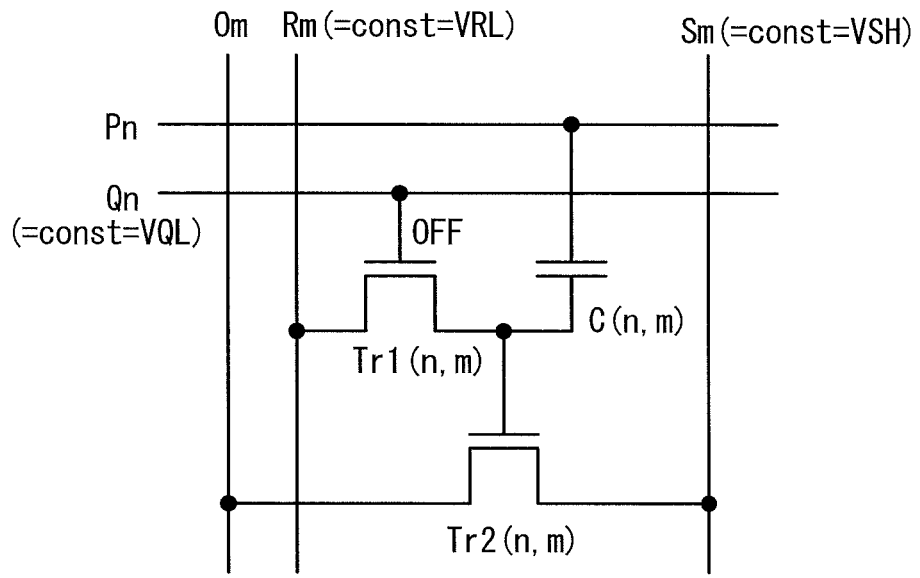

In FIG. 3A, at the time when a pulse is applied to the reading word line Pn−1, the potential of the reading bit line Om+1 is increased (a pulse is generated); at the time when a pulse is applied to the reading word line Pn, the potential of the reading bit line Om is increased. From this fact, it can be specified that the amount of charge in a memory cell in the (n−1)-th row and the (m+1)-th column and the amount of charge in the memory cell in the n-th row and the m-th column are Q3.

Then, in the case where a pulse at the height of $V_{P2}$ is applied to the reading word line, a reading transistor of a memory cell in which the amount of charge is Q3 or Q2 is turned on; thus, in a similar manner, which of the memory cells has the amount of charge of Q3 or Q2 can be known. Similarly, also in the case where a pulse at the height of $V_{P3}$ is applied to the reading word line, the potential of the reading bit line is changed depending on the amount of charge.

Reading is thus completed. The number of times of generating a pulse in each memory cell is recorded, whereby data written in the memory cell can be known. For example, according to FIG. 3A, in the memory cell in the n-th row and the m-th column, a pulse is generated three times for one reading operation. This is because the charge held is Q3 so that the reading transistor Tr2 is turned on in response to all the pulses which are applied to the reading word line Pn, and the reading bit line Om has the same potential as the bias line Sm or the potential of the reading bit line Om becomes close to the potential of the bias line Sm.

On the other hand, in a memory cell in the (n+1)-th row and the (m−1)-th column, no pulse is generated. This is because the amount of charge in the memory cell is Q0 that is the smallest and the reading transistor Tr2 is not turned on even with the pulse at the height of $V_{P3}$ that is the highest pulse. Results of adding up the number of pulses generated in each of the memory cells in this manner are shown in Table 2. In this manner, data stored in each memory cell can be read.

TABLE 2

|  | (m − 1)th column | (m)th column | (m + 1)th column |
|---|---|---|---|
| (n − 1)th row | 2 | 2 | 3 |
| (n)th row | 1 | 3 | 0 |
| (n + 1)th row | 0 | 2 | 1 |

Embodiment 2

Figure 5A:
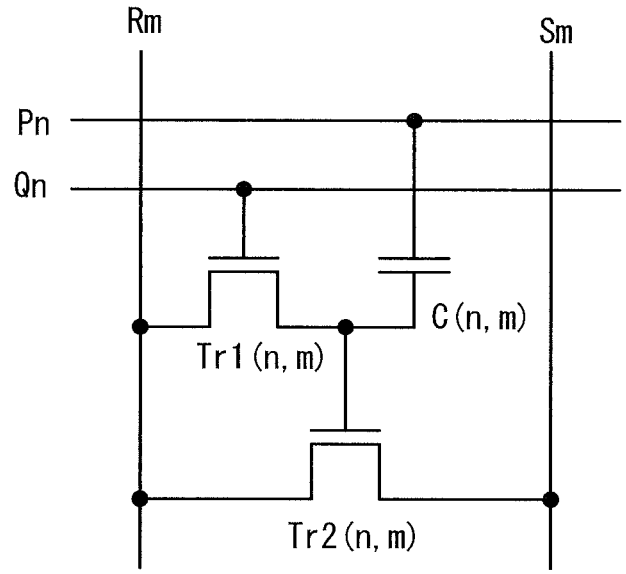
FIGS. 5A and 5B are diagrams illustrating an example of a semiconductor memory device according to an embodiment of the present invention.
Figure 5B:
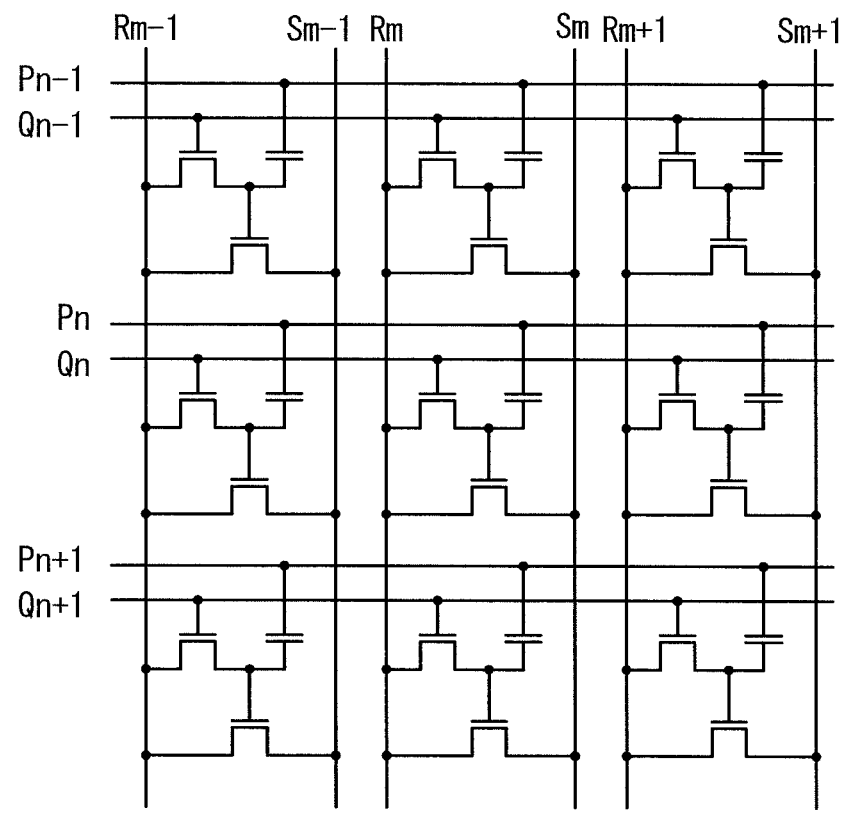

In this embodiment, operation of a semiconductor memory circuit illustrated in FIGS. 5A and 5B is described. Here, both the writing transistor Tr1 and the reading transistor Tr2 are n-channel transistors. In this embodiment, the writing bit line in Embodiment 1 is substituted for the reading bit line. As described above, by employing this structure, the number of wirings of a semiconductor memory device can be smaller than that in Embodiment 1.

A writing method is almost the same as the writing method in Embodiment 1. The bias lines ( . . . , Sm−1, Sm, Sm+1, . . . ) and the reading word lines ( . . . , Pn−1, Pn, Pn+1, . . . ) are held at constant potential. Although potential may be different depending on the kind of a wiring, the potential of any wiring is set to 0 volt here.

Then, a pulse is sequentially applied to the writing word lines ( . . . , Qn−1, Qn, Qn+1, . . . ) as illustrated in FIG. 2A so that the writing transistor is turned on/off. At the same time, a signal is applied to the writing bit lines ( . . . , Rm−1, Rm, Rm+1, . . . ) so that data is written in a memory cell. The amount of the charge held in each memory cell is similar to that described in Embodiment 1, which is shown in Table 1.

Figure 6A:
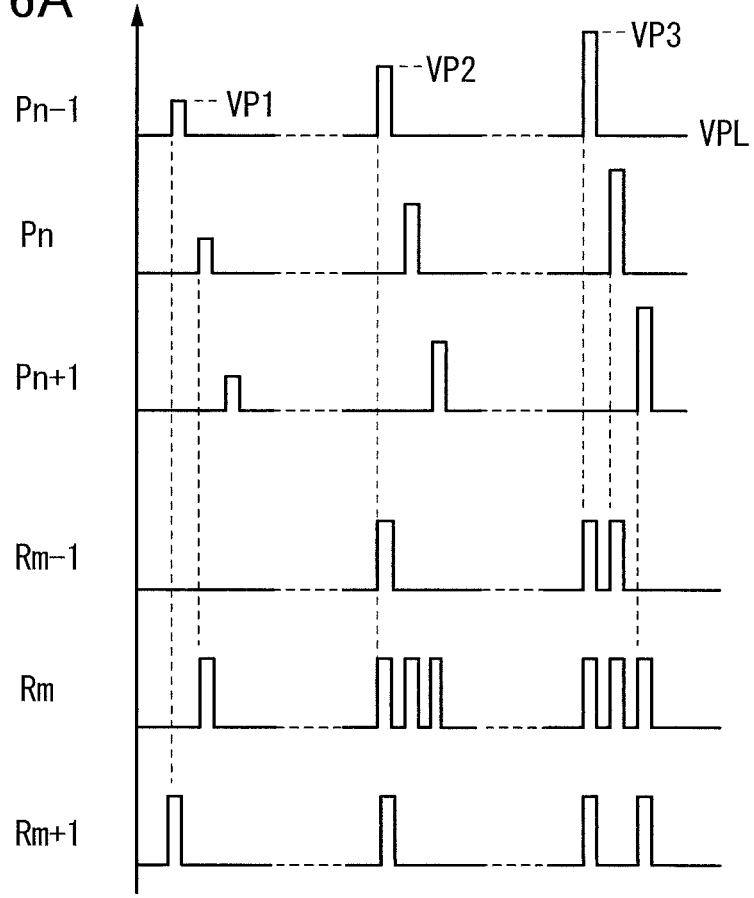
FIGS. 6A and 6B are diagrams illustrating a driving method (reading) of a semiconductor memory device according to Embodiment 2.
Figure 6B:
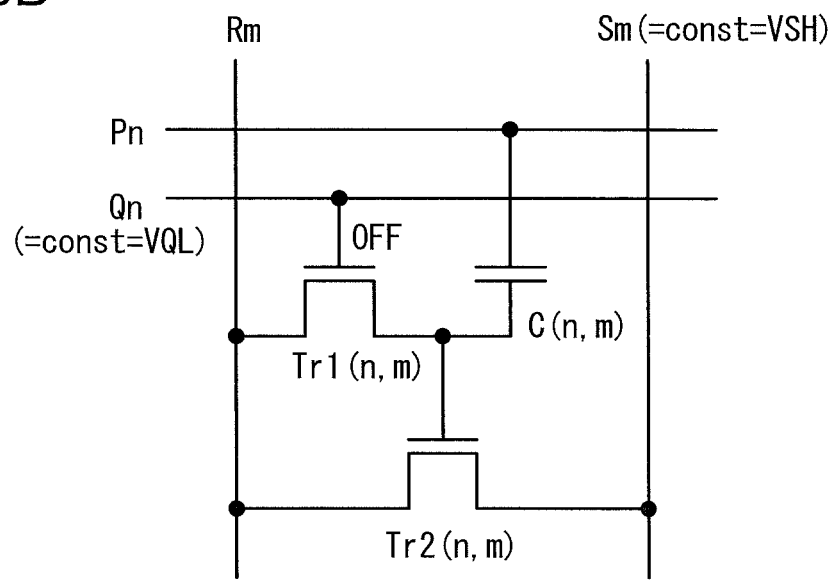

Next, a reading method is described with reference to FIGS. 6A and 6B. In an example below, data is sequentially read per row; it is also possible that only data in a specific memory cell is read in a similar manner. As illustrated in FIG. 6B, at the time of reading, constant potential is applied to the writing word lines ( . . . , Qn−1, Qn, Qn+1, . . . ). It is necessary to apply potential lower than or equal to the threshold value of the writing transistor to the writing word lines. Although the potential of the writing word line is held at $V_{QL}$ here, the line may be held at another potential. Further, the bias lines ( . . . , Sm−1, Sm, Sm+1, . . . ) are also held at constant potential $V_{SH}$. The potential $V_{SH}$ can be set to, for example, +1 volt. In addition, a load (a resistor) with an appropriate magnitude is connected to an end of the writing bit lines ( . . . , Rm−1, Rm, Rm+1, . . . ) and an end of the load is held at constant potential (0 V here).

The potential of the reading word lines ( . . . , Pn−1, Pn, Pn+1, . . . ) is held at $V_{PL}$ except when a pulse is applied. Then, as illustrated in FIG. 6A, pulses are sequentially applied to the reading word lines ( . . . , Pn−1, Pn, Pn+1, . . . ). First, the height of the pulse at first is $V_{P1}$ and the pulse is applied to all the rows; then, a pulse at the height of $V_{P2}$ is sequentially applied to the reading word lines. Then, a pulse at the height of $V_{P3}$ is sequentially applied to the reading word lines. In this manner, reading is performed. In the above description, $V_{PL}$, $V_{P1}$, $V_{P2}$, and $V_{P3}$ correspond to those already described with reference to FIG. 4B.

At this time, by monitoring the potential of the writing bit line Rm, a state (an on state or an off state) of the reading transistor Tr2 which is in response to the pulse to the reading word line can be known. Details are the same as those in Embodiment 1 and thus omitted.

Embodiment 3

In this embodiment, a shape and a manufacturing method of the semiconductor memory device described in Embodiment 2 are described. In this embodiment, an oxide semiconductor containing zinc and indium is used for the writing transistor Tr1 and a single crystal silicon semiconductor is used for the reading transistor Tr2. Therefore, a stack structure in which the writing transistor Tr1 is provided over the reading transistor Tr2 is employed.

That is, an insulated gate transistor using a single crystal silicon semiconductor which is provided over a single crystal silicon substrate is used as the reading transistor Tr2 and a transistor in which an oxide semiconductor is used for a semiconductor layer is formed thereover as the writing transistor Tr1. Note that although an example in which a semiconductor memory device is formed over a single crystal silicon substrate is described in this embodiment, the semiconductor memory device can be provided over another kind of semiconductor substrate or an insulating substrate, alternatively.

Figure 7A:
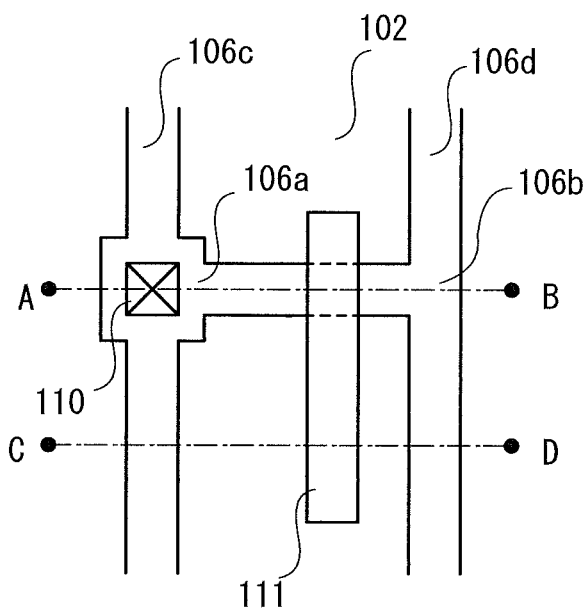
FIGS. 7A to 7C are diagrams illustrating layout and the like of wirings of a semiconductor memory device according to Embodiment 3.
Figure 7B:
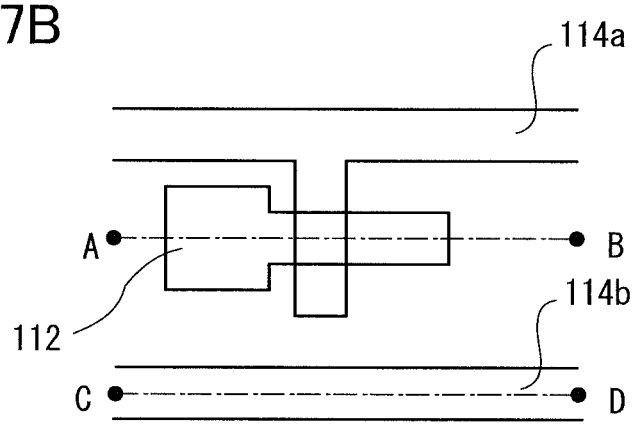
Figure 7C:
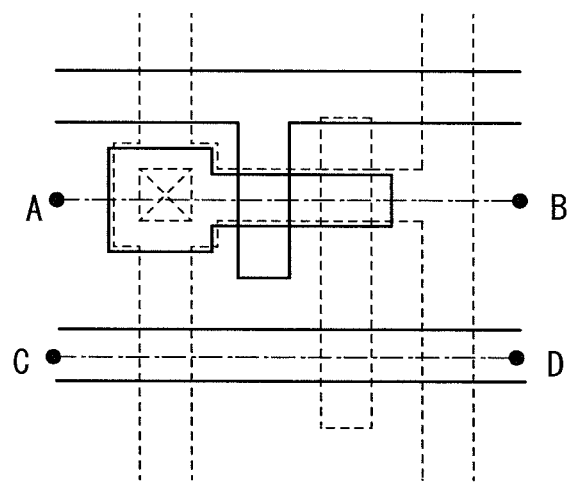

An example of layout of a memory cell of the semiconductor memory device in this embodiment is illustrated in FIGS. 7A to 7C. In FIG. 7A, main wirings, main electrodes, and the like provided over a single crystal silicon substrate are illustrated. An element separation region 102 is provided over the substrate. Further, a wiring 106c and a wiring 106d which contain a conductive material or doped silicon are formed in the region other than the element separation region 102 and connected to a source 106a and a drain 106b of the reading transistor Tr2, respectively. The wirings 106c and 106d serve as a writing bit line and a bias line, respectively. The source 106a and the drain 106b are separated from each other with a gate electrode 111 of the reading transistor Tr2. The source 106a is provided with a connection electrode 110 so as to be connected to a wiring in an upper layer.

Main wirings, main electrodes, and the like, focusing on the transistor using the oxide semiconductor are illustrated in FIG. 7B. The wirings, electrodes, and the like illustrated in FIG. 7B are formed over a circuit which is illustrated in FIG. 7A. An oxide semiconductor region 112 having an island-shape, a writing word line 114a, and a reading word line 114b are formed there. Part of the writing word line 114a overlaps with the oxide semiconductor region 112 and serves as a gate electrode of the writing transistor Tr1. The oxide semiconductor region 112 is physically in contact with the gate electrode 111 in the lower layer. A capacitor C is formed in a portion where the reading word line 114b overlaps with the gate electrode 111.

FIG. 7C illustrates a structure where the structure illustrated in FIG. 7A overlaps with the structure illustrated in FIG. 7B. In FIG. 7C, the structures are shifted a little from each other so as to see the overlap. Note that dots A, B, C, and D denote the same positions through FIGS. 7A to 7C. Although a design rule of such elements can be appropriately selected, it is preferable that a channel width of each transistor is greater than or equal to 10 nm and less than or equal to 0.4 μm and a channel length thereof is greater than or equal to 10 nm and less than or equal to 0.4 μm for increase in the integration degree.

Note that the width of the reading word line 114b in part overlapping with the gate electrode 111 (i.e., the capacitor) is almost the same as the width (the channel width) of the writing word line of the writing transistor in FIGS. 7A to 7C, however, it is preferably greater than or equal to 0.5 times and less than or equal to 1.5 times the channel width.

Figure 8A:
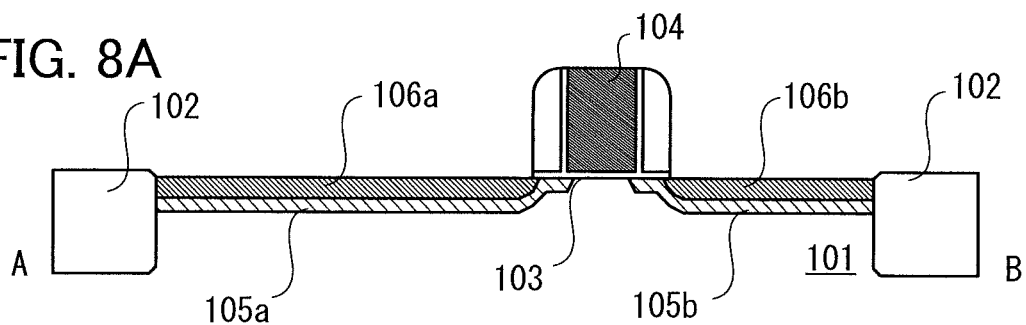
FIGS. 8A to 8E are diagrams illustrating manufacturing steps of the semiconductor memory device according to Embodiment 3.

Hereinafter, a manufacturing method of a semiconductor memory device having the above-described structure is described. FIGS. 8A to 8E and FIGS. 9A to 9D are cross-sectional views taken along a line linking dot A to dot B in FIGS. 7A to 7C. First, with the use of a known semiconductor manufacturing technique, over the single crystal silicon substrate 101, the element separation region 102 is formed; impurity regions 105a and 105b are formed using doped silicon; a gate insulating film 103 is formed; and a dummy gate 104 is formed as illustrated in FIG. 8A.

A sidewall may be provided on a side surface of the dummy gate 104. The thickness of the gate insulating film is preferably 10 nm or more so that generation of leakage current is suppressed. In order that gate capacitance be less than the capacity of a capacitor to be formed later, a material having a relatively low dielectric constant such as silicon oxide is preferably used as a material of the gate insulating film.

A silicide region may be provided over the impurity regions 105a and 105b so that conductivity is increased. In this specification, silicide regions and impurity regions which are formed in the above described manner are referred to as the source 106a and the drain 106b. As described referring to FIG. 7A, the regions are connected to the wiring 106c functioning as the writing bit line and the wiring 106d functioning as the bias line.

Figure 8B:
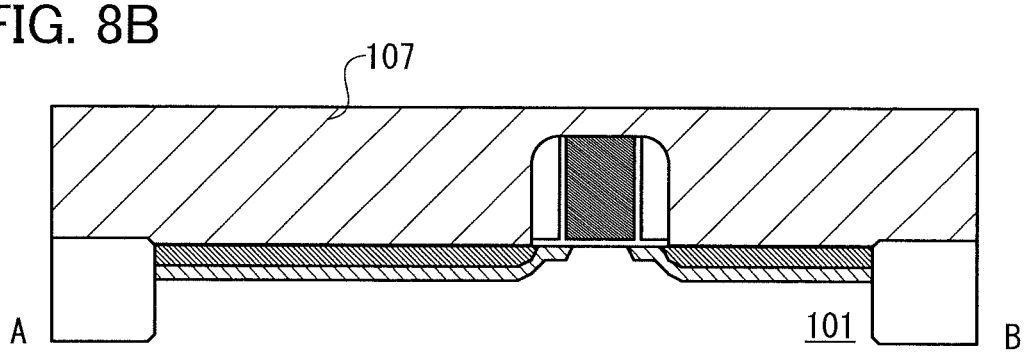
Figure 8C:
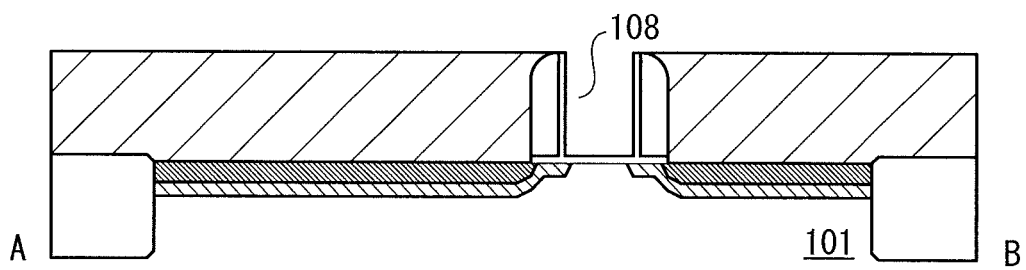
Figure 8D:
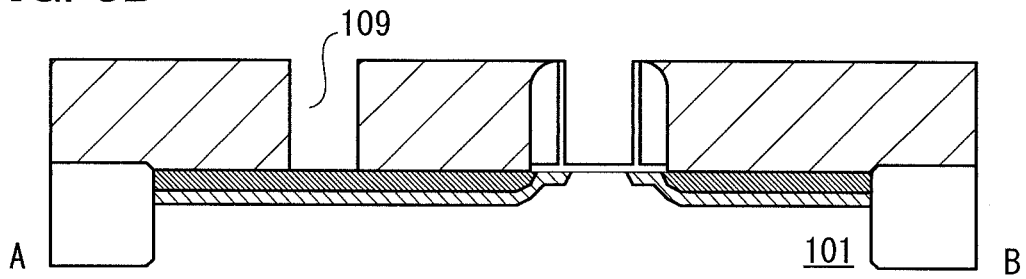

Next, an interlayer insulator 107 is formed as illustrated in FIG. 8B. The interlayer insulator 107 may be formed as a single layer or a multilayer and may include a stress liner for causing a distortion in the channel of the transistor. Then, the interlayer insulator 107 is planarized by etching by a chemical mechanical polishing (CMP) method; the etching is stopped upon exposure of the dummy gate 104. After that, as illustrated in FIG. 8C, a hole portion 108 is formed by selectively removing the dummy gate. In addition, as illustrated in FIG. 8D, a contact hole 109 is also formed.

Figure 8E:
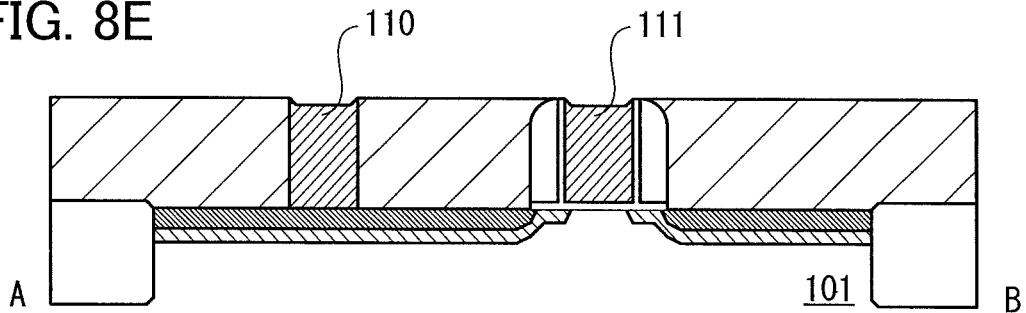

Then, a single-layer film or a stacked-layer film which contains a conductive material is deposited and planarized, whereby the gate electrode 111 and the connection electrode 110 are formed in the hole portion 108 and the contact hole 109, respectively, as illustrated in FIG. 8E. After that, surface treatment using ions of a rare gas such as argon may be performed, whereby the hydrogen concentration of a surface of the interlayer insulator 107 is reduced. A material which forms an ohmic contact with an oxide semiconductor film to be formed later is preferable as a material of the gate electrode 111 and the connection electrode 110.

An example of such a material is a material whose work function W is almost the same as or smaller than electron affinity φ (an energy gap between the lowest end of the conduction band of the oxide semiconductor and the vacuum level) of the oxide semiconductor. In other words, W<φ+0.3 [electron volt] may be satisfied. For example, titanium, molybdenum, and titanium nitride can be given.

Figure 9A:
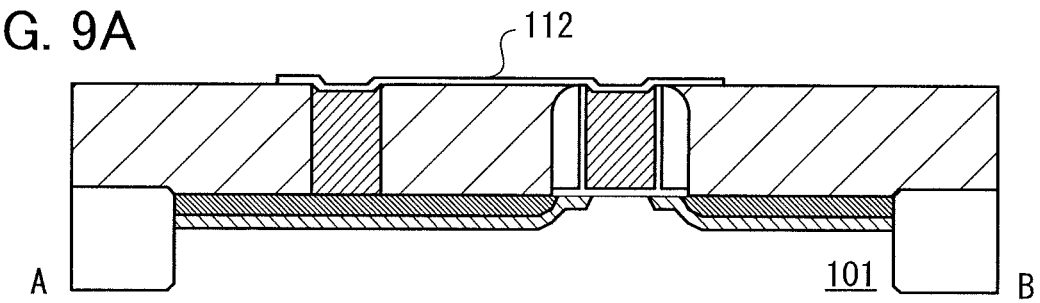
FIGS. 9A to 9D are diagrams illustrating manufacturing steps of the semiconductor memory device according to Embodiment 3.

Then, the oxide semiconductor film having a thickness of 3 nm to 30 nm is formed by a sputtering method. A method other than a sputtering method may be employed as a method for forming the oxide semiconductor film. The oxide semiconductor preferably contains zinc and indium. As illustrated in FIG. 9A, the oxide semiconductor region 112 having an island-shape is formed by etching the oxide semiconductor film. The oxide semiconductor region 112 may be subjected to heat treatment so that semiconductor characteristics are improved. Thus, the gate electrode 111 is in contact with the oxide semiconductor region 112 and the connection electrode 110 is in contact with the oxide semiconductor region 112.

Figure 9B:
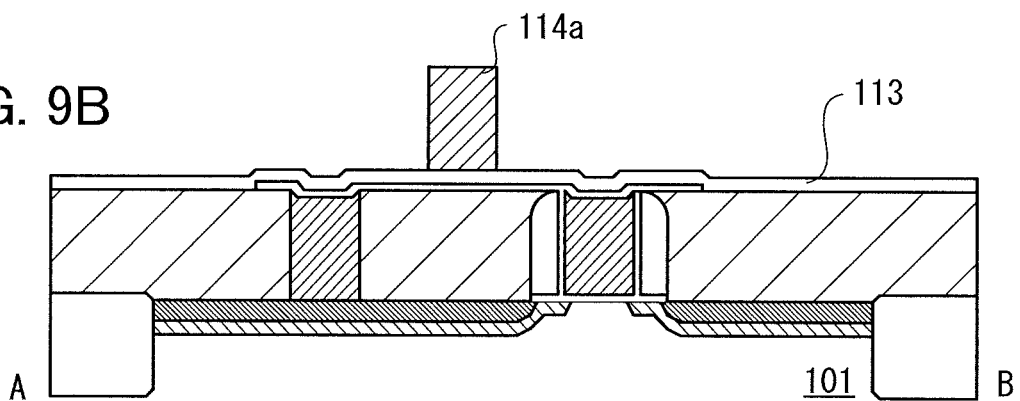

Then, a gate insulating film 113 is formed by a known deposition method such as a sputtering method as illustrated in FIG. 9B. In order that generation of leakage current be reduced, the thickness of the gate insulating film 113 is preferably 20 nm or more and the hydrogen concentration in the gate insulating film is preferably $1\times10^{-19}$ cm$^{-3}$ or less. Silicon oxide, aluminum oxide, hafnium oxide, lanthanum oxide, aluminum nitride, or the like may be used for the gate insulating film. The gate insulating film 113 serves as a dielectric of the capacitor and is preferably formed using a material with a relative permittivity of 10 or more.

Heat treatment may be performed after the gate insulating film is formed so as to improve semiconductor characteristics. After that, the writing word line 114a and the reading word line 114b (not shown in FIGS. 9A to 9D) are formed using a conductive material. Part of the writing word line 114a serves as the gate electrode of the transistor using the oxide semiconductor. As a material of the writing word line 114a and the reading word line 114b, a material whose work function is larger than the electron affinity of the oxide semiconductor by 0.5 electron volts or more is preferable. Tungsten, gold, platinum, p-type silicon and the like can be given as examples.

Figure 9C:
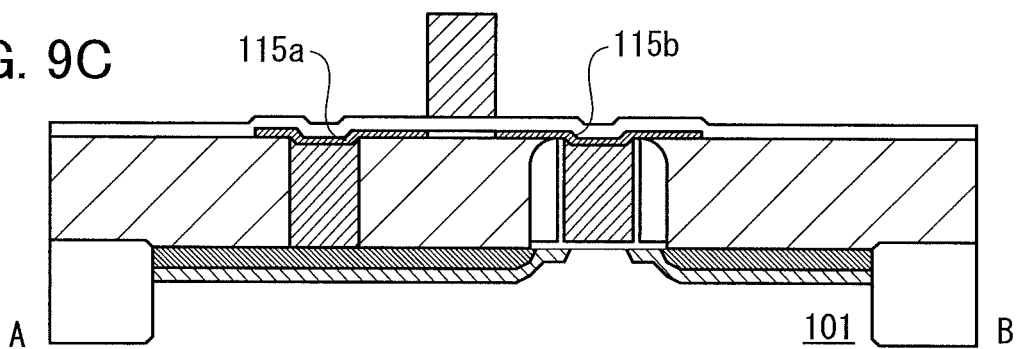

Then, as illustrated in FIG. 9C, ions of an element which is more easily oxidized than the oxide semiconductor are implanted to the oxide semiconductor region by a known method for implanting ions. Examples of such an element are titanium, zinc, magnesium, silicon, phosphorus, boron, and the like. In general, boron and phosphorus are used in a conventional semiconductor process and thus easy to be used; particularly, as an ion to be implanted to the above-described thin gate insulating film 113 or the oxide semiconductor region 112, a phosphorus ion, whose atomic weight is greater than the atomic weight of a boron ion, is preferable.

In the oxide semiconductor, oxygen deficiency is caused by the above-described implantation of ions and n-type conductivity is exhibited. An oxide semiconductor is different from a silicon semiconductor in that many oxide semiconductors can obtain high conductivity without such heat treatment which is needed in the case of a silicon semiconductor for recovery of crystallinity after implantation of ions. Needless to say, heat treatment may be performed on the oxide semiconductor after the implantation of ions. In this manner, regions 115a and 115b exhibiting n-type conductivity are formed in the oxide semiconductor region 112. It is preferable that conditions of implantation of ions be set so that carrier (electron) concentration in these regions is $1\times10^{-19}$ cm$^{-3}$ or more.

Figure 9D:
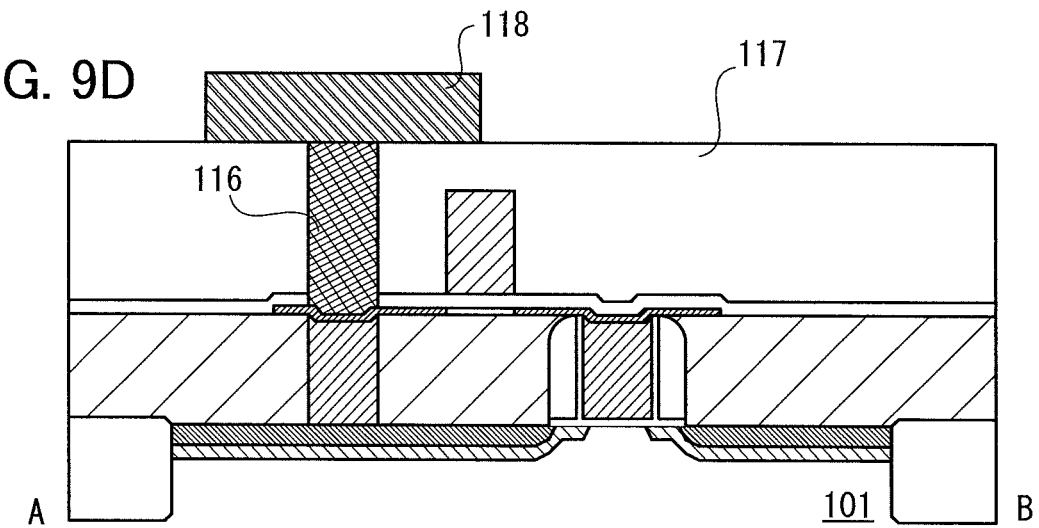

A basic element structure is completed through the above steps. After that, an interlayer insulator 117 of a single-layer thin film or a multilayer thin film is formed. A surface of the interlayer insulator 117 is planarized and a contact hole reaching the oxide semiconductor region is formed, and a connection electrode 116 is embedded therein. Next, a wiring 118 is formed. The wiring 118 is a wiring parallel to the wiring 106c functioning as the writing bit line and is formed so that substantial resistance of the wiring 106c is reduced. A similar wiring may be provided parallel to the writing word line 114a and the reading word line 114b. In this manner, the memory cell of the semiconductor memory device illustrated in FIG. 9D is manufactured.

Figure 10:
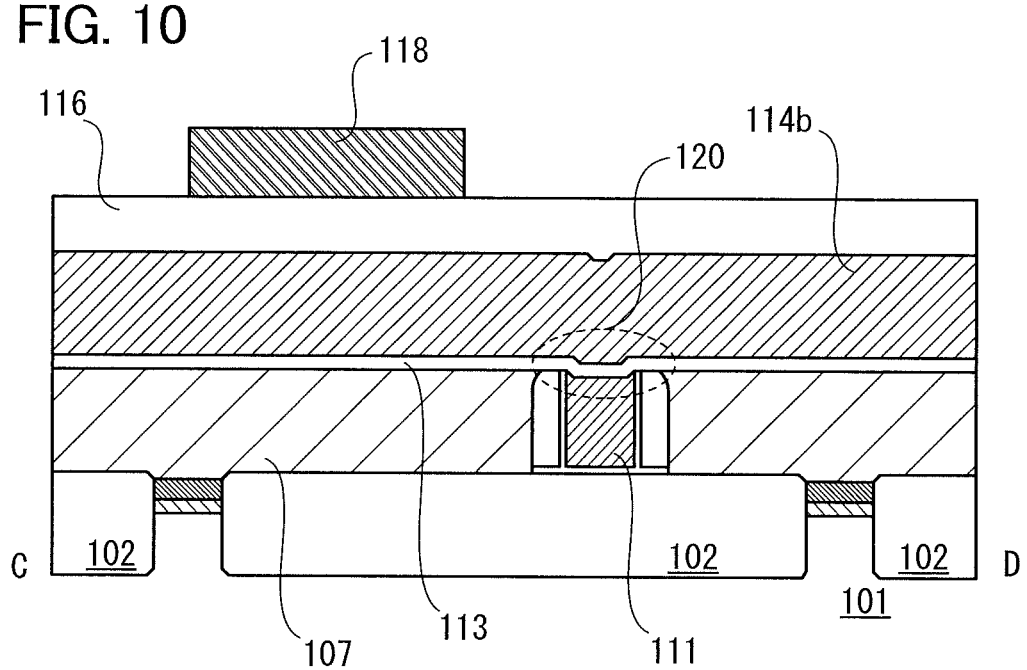
FIG. 10 is a cross-sectional view of the semiconductor memory device according to Embodiment 3.

FIG. 10 is a cross-sectional view taken along a line linking dot C to dot D in FIGS. 7A to 7C. As illustrated in the diagram, a capacitor 120 with the gate insulating film 113 as a dielectric is formed between the gate electrode 111 and the reading word line 114b. The capacity of the capacitor 120 is determined by the magnitude of overlapped part of the gate electrode 111 with the reading word line 114b; the area of the capacitor 120 is preferably greater than or equal to 100 nm$^2$ and less than or equal to 0.01 µm$^2$.

In light of increase in the integration degree of the semiconductor memory device, the area of the capacitor 120 is preferably less than or equal to two times the area (hereinafter referred to as $S_{Tr1}$) which is determined by the channel width and the channel length of the reading transistor Tr2, preferably greater than or equal to one-tenth of $S_{Tr1}$ and less than $S_{Tr1}$.

Embodiment 4

Figure 11A:
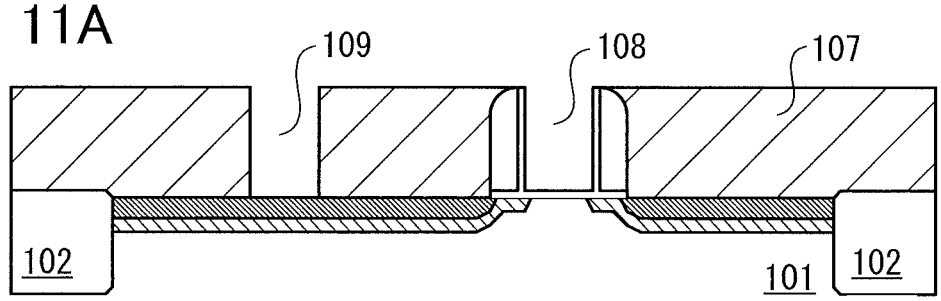
FIGS. 11A to 11D are diagrams illustrating manufacturing steps of a semiconductor memory device according to Embodiment 4.

In this embodiment, a manufacturing method of a memory cell of a semiconductor memory device, which is different from that in Embodiment 3, is described with reference to FIGS. 11A to 11D. Similarly to Embodiment 3, the element separation region 102, the source, the drain, the gate insulating film, and the dummy gate are formed over the single crystal silicon substrate 101. Then, after the interlayer insulator 107 is formed, the interlayer insulator 107 is planarized while etching is performed so that the dummy gate is selectively removed, whereby the hole portion 108 is formed as illustrated in FIG. 11A. In addition, the contact hole 109 is formed.

Then, a film is formed using a conductive material so as to be embedded in the hole portion 108 and the contact hole 109. The film is patterned, whereby an electrode 110a and an electrode 111a are formed. The distance between the electrode 110a and the electrode 111a at this time is the channel length of the transistor using the oxide semiconductor. Similarly to the case of the gate electrode 111 and the connection electrode 110 in Embodiment 3, the conductive material used may be selected in consideration of the electron affinity of the oxide semiconductor. It is preferable that a conductive material whose work function is almost the same as or smaller than the electron affinity of the oxide semiconductor be provided at least in a portion in contact with the oxide semiconductor film to be formed later.

Figure 11B:
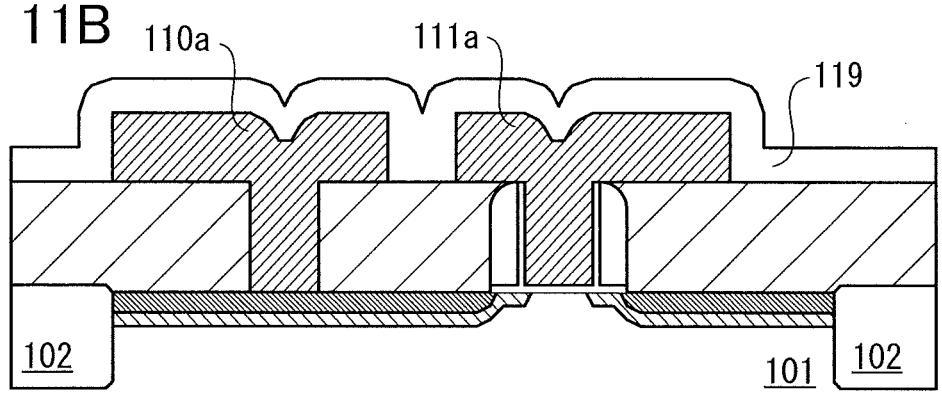
Figure 11C:
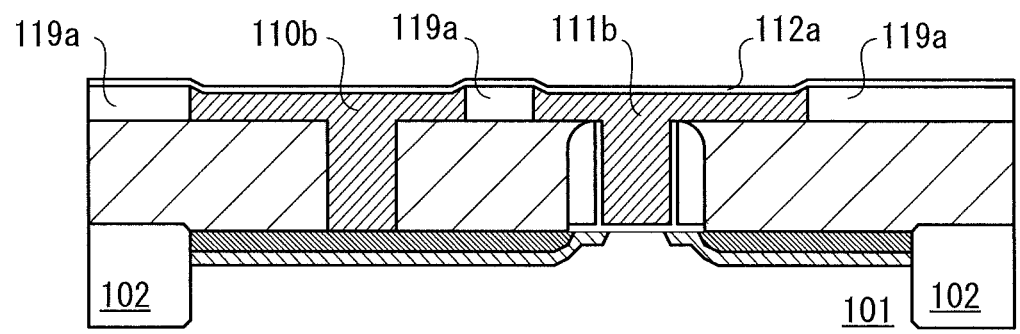

Further, as illustrated in FIG. 11B, an insulating film 119 containing silicon oxide or the like is formed to an appropriate thickness. After that, the insulating film 119 and the electrodes 110a and 111a are etched and planarized as illustrated in FIG. 11C. Through the above steps, a connection electrode 110b and a gate electrode 111b of the reading transistor are obtained. The insulating film 119 is etched so as to be an insulating film 119a.

Then, an oxide semiconductor film 112a having a thickness of 3 nm to 10 nm is formed. The oxide semiconductor film 112a may be subjected to heat treatment so that semiconductor characteristics are improved. The resistivity of the oxide semiconductor film is made to be $10 \times 10^{10}$ Ωm or more. Thus, the gate electrode 111b is in contact with the oxide semiconductor film 112a, and the connection electrode 110b is in contact with the oxide semiconductor film 112a.

Figure 11D:
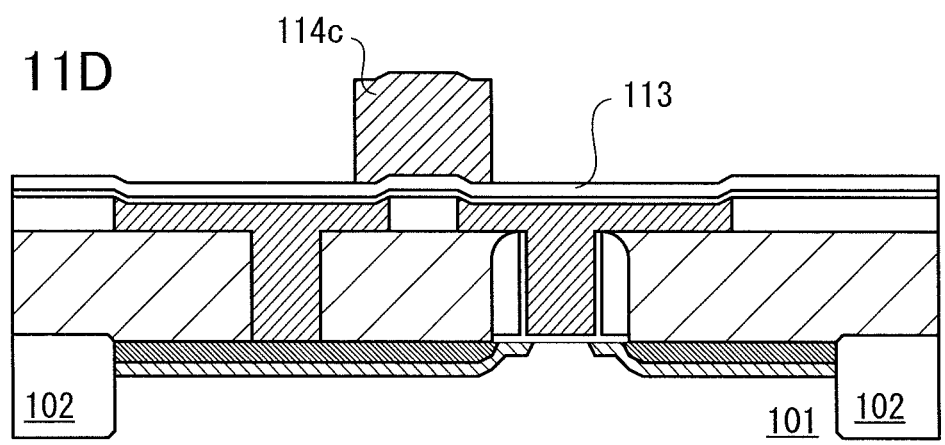

After that, the gate insulating film 113 and a gate electrode 114c are formed as illustrated in FIG. 11D. Similarly to the case of the writing word line 114a and the reading word line 114b in Embodiment 3, a material of the gate electrode 114c may be selected in consideration of the electron affinity of the oxide semiconductor. According to this embodiment, transistor characteristics can be obtained without ion implantation unlike Embodiment 3.

Embodiment 5

In the semiconductor memory device described in Embodiment 2, the writing bit line in the semiconductor memory device described in Embodiment 1 is substituted for the reading bit line. However, there is a problem of increase in power consumption at the time of writing in this structure, which is caused by reasons below.

For example, positive charge is held in the memory cell in the n-th row and the m-th column and as a result, the reading transistor Tr2(n,m) of the memory cell is turned on in some cases. The drain of this transistor is connected to the bias line Sm and the source is connected to the writing bit line Rm. At the time of writing, the bias line Sm is held at constant potential; on the other hand, the potential of the writing bit line Rm is changed because data is written in another memory cell in the same column. As a result, current flows between the source and the drain of the reading transistor Tr2(n,m) at the time of writing.

In order to prevent such current, a signal which is the same as a signal applied to the writing bit line Rm may be applied to the bias line in the same phase as the signal applied to the writing bit line Rm, so that the potential of the bias line Sm is the same as the potential of the writing bit line Rm. Alternatively, a signal applied to the bias line Sm may be synchronized with a signal applied to the writing bit line Rm.

Figure 12A:
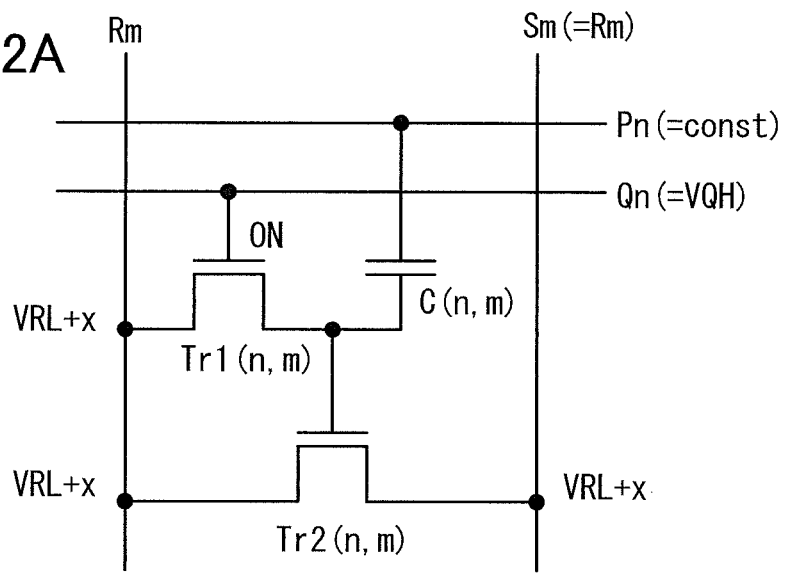
FIGS. 12A and 12B are circuit diagrams of a semiconductor memory device according to Embodiment 5.

FIG. 12A is a diagram for illustrating potential applied to the memory cell in the n-th row and the m-th column in this embodiment. In the state illustrated in the diagram, the potential of the writing word line Qn is $V_{QH}$ and the writing transistor Tr1(n,m) is turned on. Thus, potential on the drain side of the writing transistor Tr1(n,m) is the same as or close to the potential of the writing bit line Rm. Here, the reading transistor Tr2(n,m) is turned on.

When the potential of the writing bit line Rm connected to the source of the reading transistor Tr2(n,m) and that of the bias line Sm connected to the drain of the reading transistor Tr2(n,m) are different from each other, current flows between the source and the drain of the reading transistor Tr2(n,m) in some cases depending on the potential of the gate of the reading transistor Tr2(n,m). However, in this embodiment, current does not flow between the source and the drain of the reading transistor Tr2(n,m) in theory because the potential of the writing bit line Rm and that of the bias line Sm are set to be equal to each other.

Even when the potential of the writing bit line Rm and that of the bias line Sm are not the same, current flowing between the source and the drain of the reading transistor Tr2(n,m) can be sufficiently reduced by adjusting the potential of the bias line Sm to that of the writing bit line Rm so that an effective potential difference is sufficiently small. In order that an effect of this embodiment is obtained, the phase of the potential of the bias line Sm is preferably deviated from the phase of the potential of the writing bit line Rm by 5% or less.

Figure 12B:
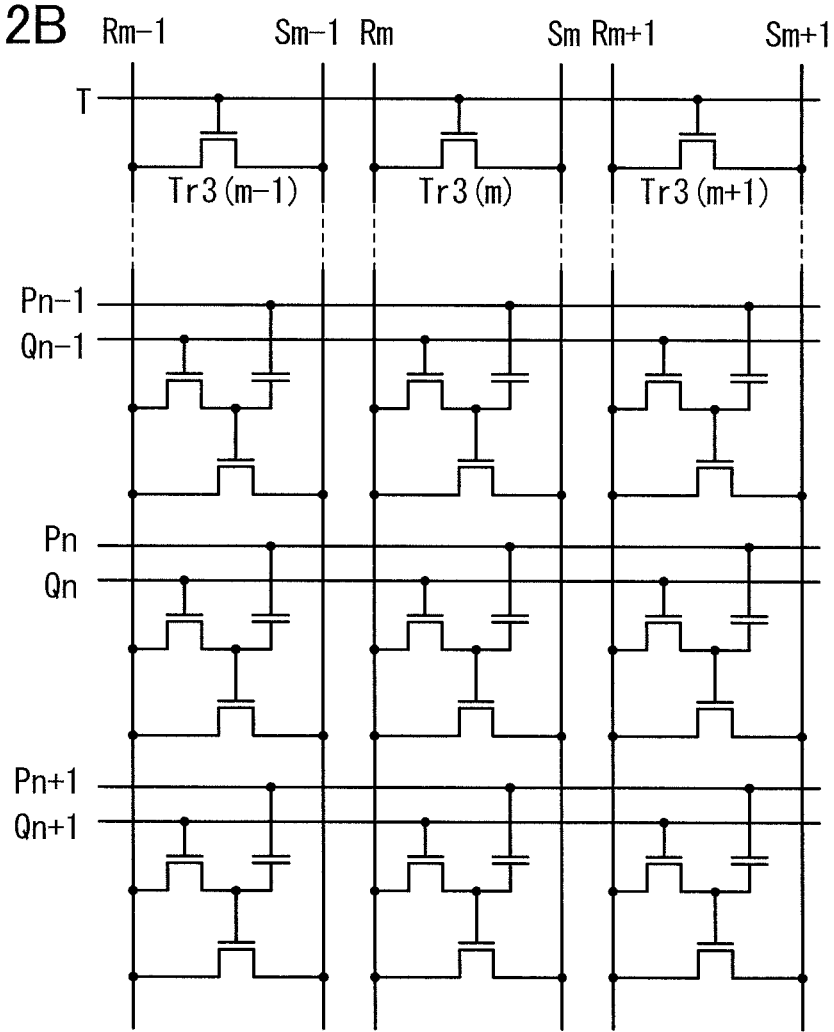
Figure 13A:
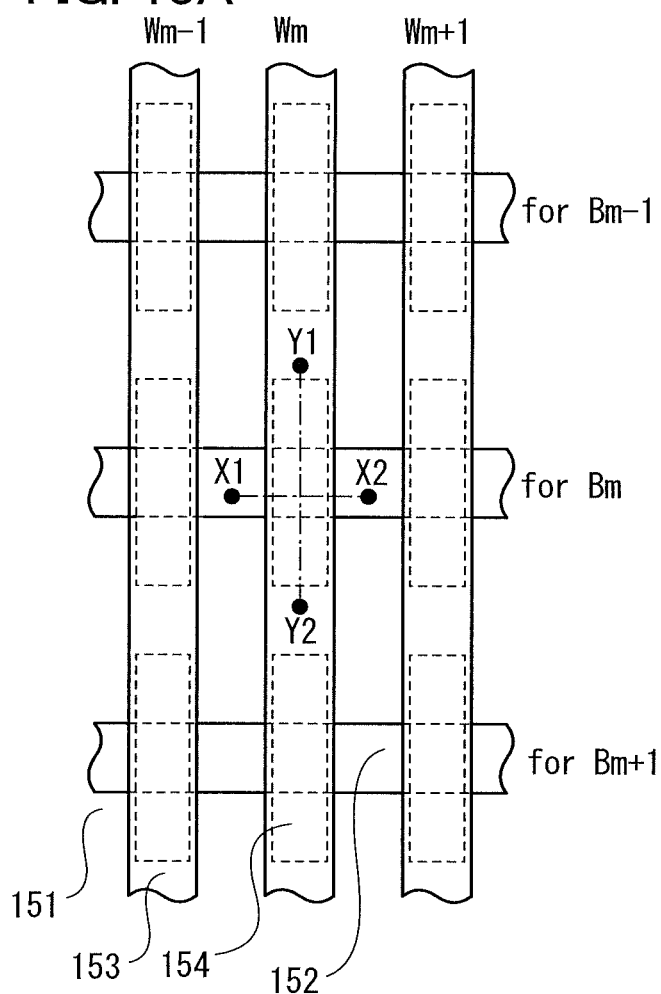
FIGS. 13A to 13D are diagrams illustrating a structure of a conventional FGNVM (a NAND-type flash memory)
Figure 13B:
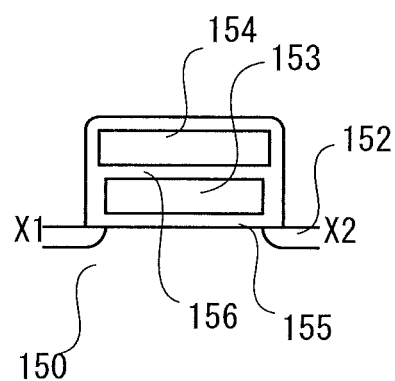
Figure 13C:
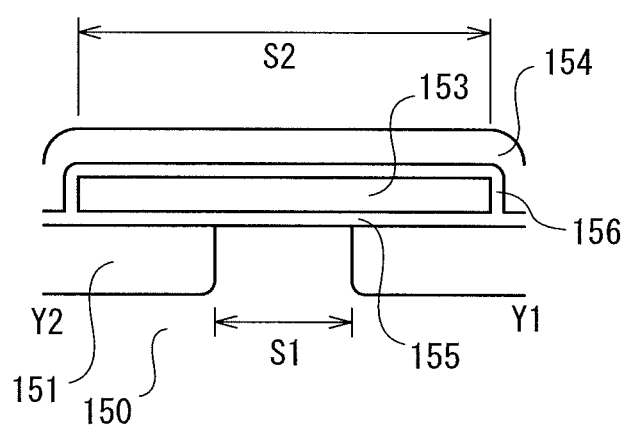
Figure 13D:
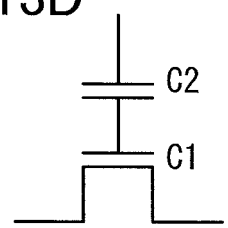

As illustrated in FIG. 12B, a switching transistor Tr3 may be provided in a portion inputting a signal to the matrix in the semiconductor memory device in order to apply such a signal to the bias line. The switching transistor Tr3 is provided in each column and the source and the drain thereof are respectively connected to the writing bit line and the bias line in each column. The gate of the switching transistor is connected to a control line T which is orthogonal to the writing bit line and the bias line.

By applying an appropriate signal to T with all the bias lines being in a floating state at the time of writing, all the switching transistors Tr3 can be turned on and the bias line and the writing bit line can be at almost the same potential in each column. Although a method is illustrated in FIG. 12B in which the writing bit line and the bias line are at almost the same potential with the use of the switching transistor Tr3, a mechanism having a similar function may be alternatively provided using a plurality of transistors, diodes, capacitors, or the like.

Embodiment 6

Figure 14A:
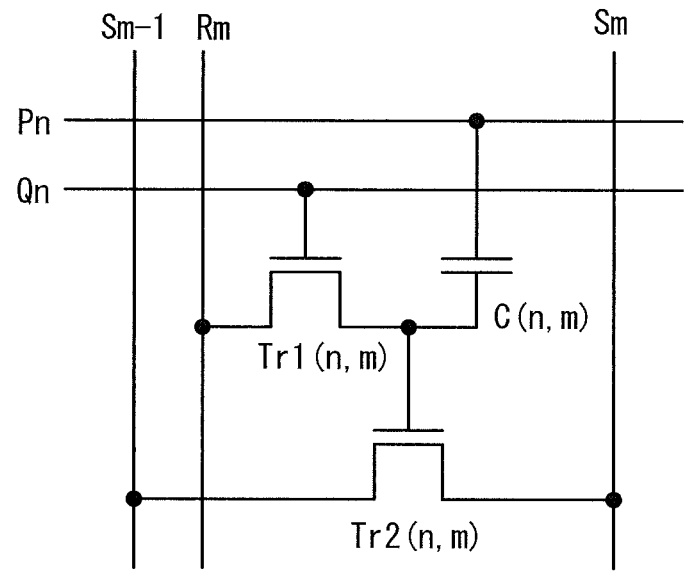
FIGS. 14A and 14B are diagrams illustrating an example of a semiconductor memory device according to an embodiment of the present invention.
Figure 14B:
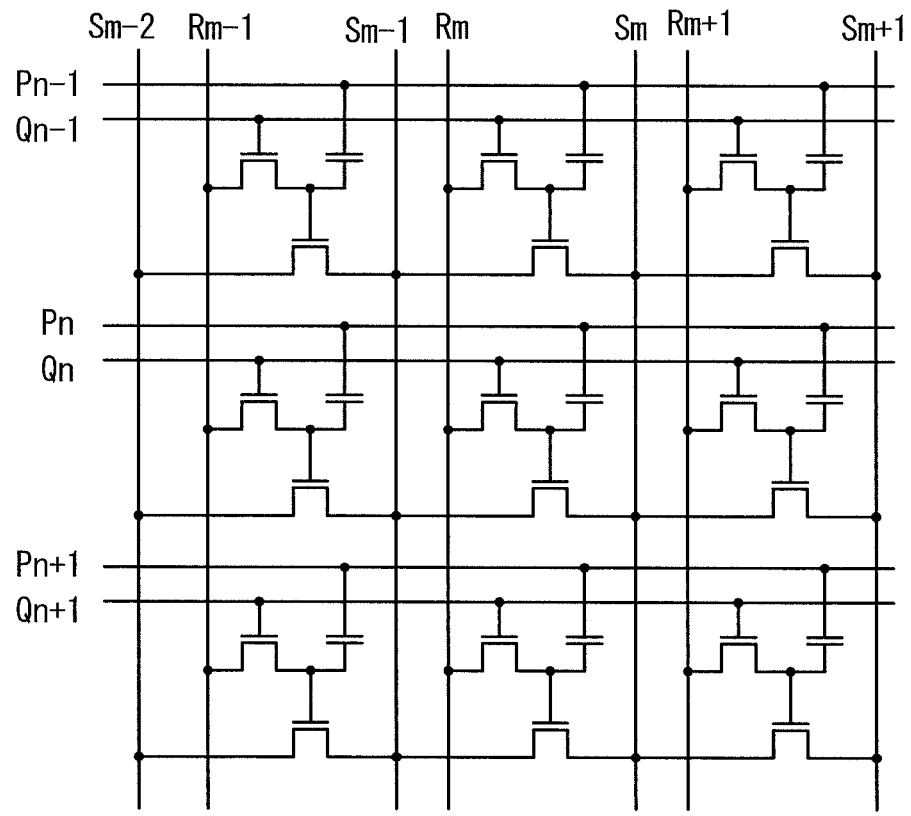

In this embodiment, operation of a semiconductor memory circuit illustrated in FIGS. 14A and 14B is described. Since the semiconductor memory circuit illustrated in FIGS. 14A and 14B is operated also by a method other than a method described in this embodiment, it is to be noted that the method by which the semiconductor memory circuit operates is not necessarily limited to the method described in this embodiment.

In this embodiment, both the writing transistor Tr1 and the reading transistor Tr2 are re-channel transistors. In this embodiment, a bias line is substituted for the reading bit line in another column of the semiconductor memory device described in Embodiment 1. As described above, by employing this structure, the number of wirings of a semiconductor memory device can be smaller than that in Embodiment 1.

A writing method is almost the same as the writing method in Embodiment 1. The bias lines ( . . . , Sm−1, Sm, Sm+1, . . . ) and the reading word lines ( . . . , Pn−1, Pn, Pn+1, . . . ) are held at constant potential. Although potential may be different depending on the kind of a wiring, the potential of any wiring is set to 0 volt here.

Then, a pulse is sequentially applied to the writing word lines ( . . . , Qn−1, Qn, Qn+1, . . . ) as illustrated in FIG. 2A so that the writing transistor is turned on/off. At the same time, a signal is applied to the writing bit lines ( . . . , Rm−1, Rm, Rm+1, . . . ) so that data is written in a memory cell. The amount of the charge held in each memory cell is similar to that described in Embodiment 1, which is shown in Table 1.

Then, a reading method is described with reference to FIGS. 15A and 15B, FIGS. 16A and 16B, and FIGS. 17A to 17E. As illustrated in FIG. 15B, at the time of reading, constant potential is applied to the writing word lines ( . . . , Qn−1, Qn, Qn+1, . . . ). It is necessary to apply potential lower than or equal to the threshold value of the writing transistor to the writing word lines. Although the potential of the writing word line is held at $V_{QL}$ here, the line may be held at another potential.

Further, the bias lines ( . . . , Sm−1, Sm, Sm+1, . . . ) are held at potential $V_{SH}$ or potential $V_{SL}$ ($V_{SH}$>$V_{SL}$) or is connected to a potential judge circuit, depending on a column in which reading is performed. The potential judge circuit may include a means for supplying potential. The potential judge circuit is provided for each column and is electrically connected to the bias line Sm in the m-th column when reading is performed in memory cells in the m-th column.

The potential judge circuit includes at least a terminal of a wiring capable of being connected to the bias line, a potential measure means, a capacitor, and a switching mechanism which switches connection of the capacitor between the potential measure means and the terminal. The bias line Sm is connected to one of the capacitor and the potential measure means by the switching mechanism at the time of reading data in the m-th column.

Figure 16A:
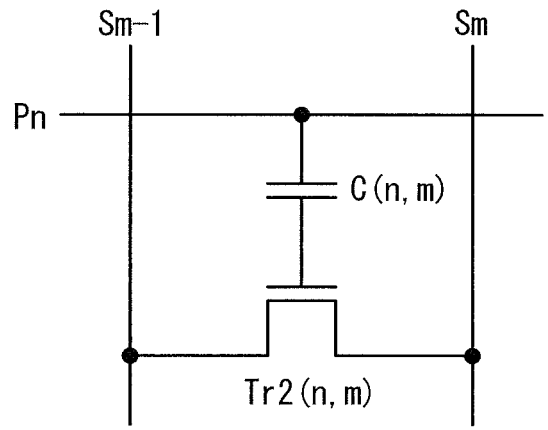
FIGS. 16A and 16B are diagrams illustrating the driving method (reading) of the semiconductor memory device according to Embodiment 6.
Figure 16B:
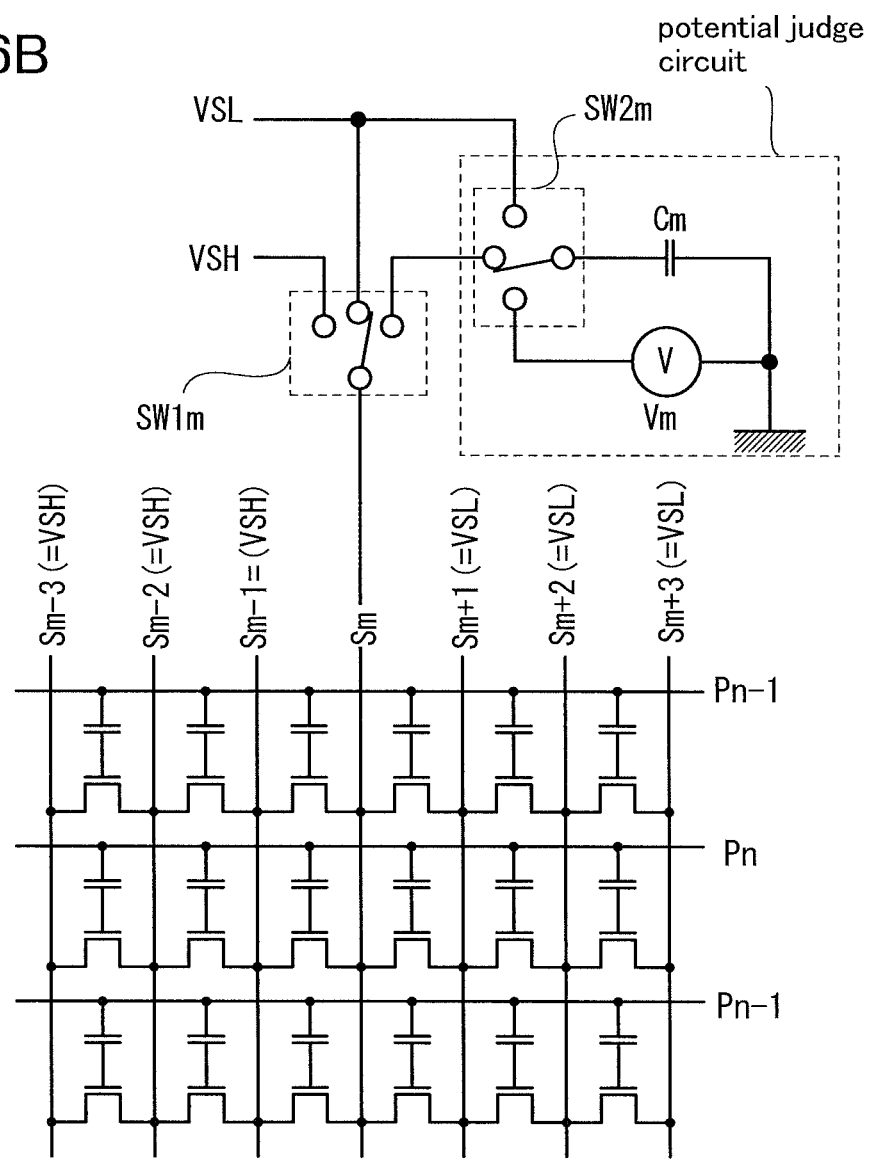

A potential judge circuit in the m-th column and a means for supplying $V_{SL}$ and/or $V_{SH}$ to the bias line Sm are illustrated in FIG. 16B. The bias line Sm can be connected to one of the potential judge circuit and the means by a switch SW1m. The potential judge circuit in the m-th column includes, as illustrated in FIG. 16B, a switch SW2m, a potential measure means Vm, a capacitor Cm, and a terminal connected to the means for supplying potential $V_{SL}$. The switch SW2m connects the capacitor to any of a wiring on the bias line Sm side, the terminal, and the potential measure means Vm. The potential of the capacitor is preferably set to $V_{SL}$ by connecting the capacitor to the terminal except when reading of data is performed.

A method for reading data in the n-th row and the m-th column is described below. The circuit illustrated in FIG. 14A at the time of reading is expressed by an equivalent circuit illustrated in FIG. 16A. Thus, the memory cell in the n-th row and the m-th column and memory cells around the memory cell are expressed as a matrix illustrated in FIG. 16B at the time of reading. When data in the memory cells in the m-th column is read, the potential of the bias lines in the (m−1)-th column and columns on the left side of the (m−1)-th column is set to $V_{SH}$ and the potential of the bias lines in the (m+1)-th column and columns on the right side of the (m+1)-th column is set to $V_{SL}$.

The potential of the bias line Sm in the m-th column is set to $V_{SL}$ by the switch SW1m before the bias line Sm in the m-th column is connected to the potential judge circuit. Then, the bias line Sm and the potential judge circuit are connected to each other by the switch SW1m. At this time, in the potential judge circuit, the bias line Sm and the capacitor Cm are connected to each other. Power is stored in the capacitor Cm so that the potential of the capacitor Cm on the bias line Sm side is $V_{SL}$.

In each of reading transistors of memory cells on the left side of the bias line Sm−1 and memory cells on the right side of the bias line Sm+1, source and drain are at the same potential and current does not flow; therefore, the memory cells can be considered not to exist in the circuit. Memory cells other than memory cells connected to the reading word line Pn can also be considered not to exist in the circuit because reading transistors therein are in an off state.

Figure 17A:
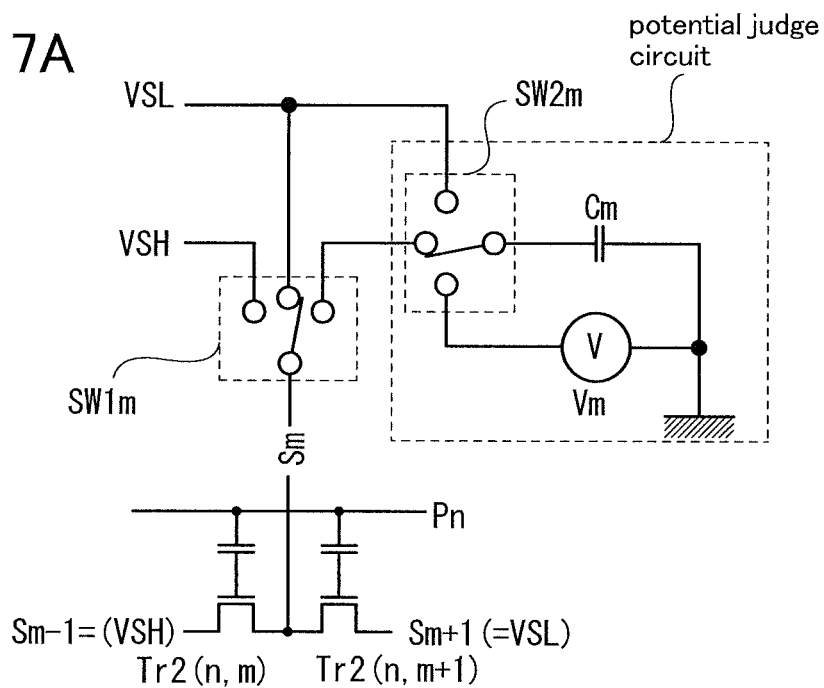
FIGS. 17A to 17E are diagrams illustrating the driving method (reading) of the semiconductor memory device according to Embodiment 6.

As a result, as illustrated in FIG. 17A, circuits which can be considered to function as part of the circuit are the memory cell in the n-th row and the m-th column and the memory cell in the n-th row and the (m+1)-th column with the bias line Sm provided therebetween, particularly, a circuit including the reading transistor Tr2(n,m) and a reading transistor Tr2(n,m+1) in its center portion. These transistors are turned on/off in accordance with the potential of the reading word line Pn in the n-th row.

It is considered that a transistor in an off state becomes extremely high resistance and breaks a circuit. This state can be expressed as a capacitor having an extremely small capacity. On the other hand, the transistor has limited resistance even in an on state. Therefore, depending on combination of an on state and an off state of the reading transistor Tr2(n,m) and the reading transistor Tr2(n,m+1) (that is, combination of data in the memory cell in the n-th row and the m-th column and data in the memory cell in the n-th row and the (m+1)-th column), equivalent circuits illustrated in FIGS. 17B to 17E are obtained.

Figure 17B:
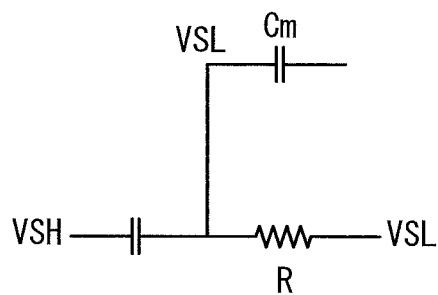
Figure 17C:
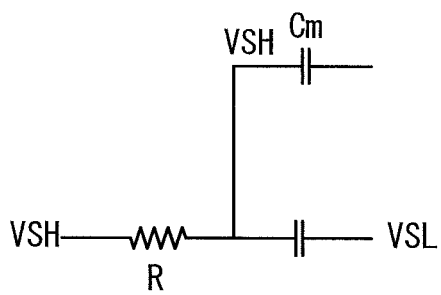
Figure 17D:
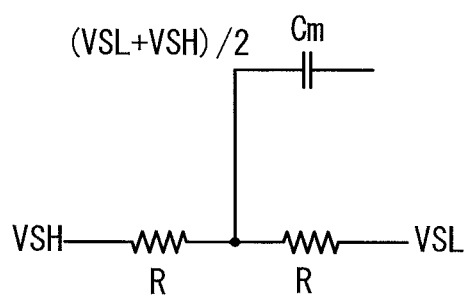

For example, when the reading transistor Tr2(n,m) is in an off state and the reading transistor Tr2(n,m+1) is in an on state, the circuit illustrated in FIG. 17B is formed. Similarly, when the reading transistor Tr2(n,m) is in an on state and the reading transistor Tr2(n,m+1) is in an off state, the circuit illustrated in FIG. 17C is formed. When both the reading transistor Tr2(n,m) and the reading transistor Tr2(n,m+1) are in an on state, the circuit illustrated in FIG. 17D is formed. When the reading transistor Tr2(n,m) and the reading transistor Tr2(n,m+1) are in an off state, the circuit illustrated in FIG. 17E is formed.

The more uniform the size or shape of transistors, the closer the resistance of the transistor each other. Transistors of exactly the same size have the same resistance. Since the transistors used in the memory cells are designed to have the same volume, size, material, or shape, it can be considered that the transistors have almost the same resistance.

Figure 17E:
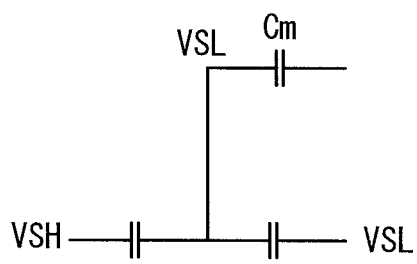

The potential of the capacitor Cm on the bias line Sm side when the circuit becomes stable and current stops flowing (i.e., when a constant state is realized; in other words, when charge corresponding to the state is stored in the capacitor Cm) is ideally $V_{SL}$ in FIG. 17B, $V_{SH}$ in FIG. 17C, $V_{SH/2}$ in FIG. 17D, and $V_{SL}$ in FIG. 17E. In FIG. 17E, since a state of the bias line is not changed from the initial state, the potential of the capacitor Cm on the bias line Sm side is $V_{SL}$.

Here, regardless of the state of the reading transistor Tr(n, m+1), the potential of the capacitor Cm on the bias line Sm side is $V_{SL}$ when the reading transistor Tr2(n,m) is in an off state (the state illustrated in FIG. 17B and that illustrated in FIG. 17E). Alternatively, regardless of the state of the reading transistor Tr(n,m+1), the potential of the capacitor Cm on the bias line Sm side has a value other than $V_{SL}$ when the reading transistor Tr2(n,m) is in an on state (the state illustrated in FIG. 17C and that illustrated in FIG. 17D). Thus, by observing the potential of the capacitor Cm on the bias line Sm side, the state of the reading transistor Tr2(n,m) can be known.

The value of $V_{SH}$ and that of $V_{SL}$ can be, for example, +1 volt and 0 volt, respectively. The potential of the capacitor Cm on the bias line side can be measured by connecting the capacitor Cm and the potential measure means Vm by the switch SW2m. In the case where the ground potential is 0 volt and it is observed that some charge other than 0 V is stored in the capacitor Cm by the potential measure means Vm, it can be known that the reading transistor Tr2(n,m) is in an on state. On the other hand, in the case where the potential of the capacitor Cm is 0 V, it can be known that the reading transistor Tr2(n,m) is in an off state.

Figure 15A:
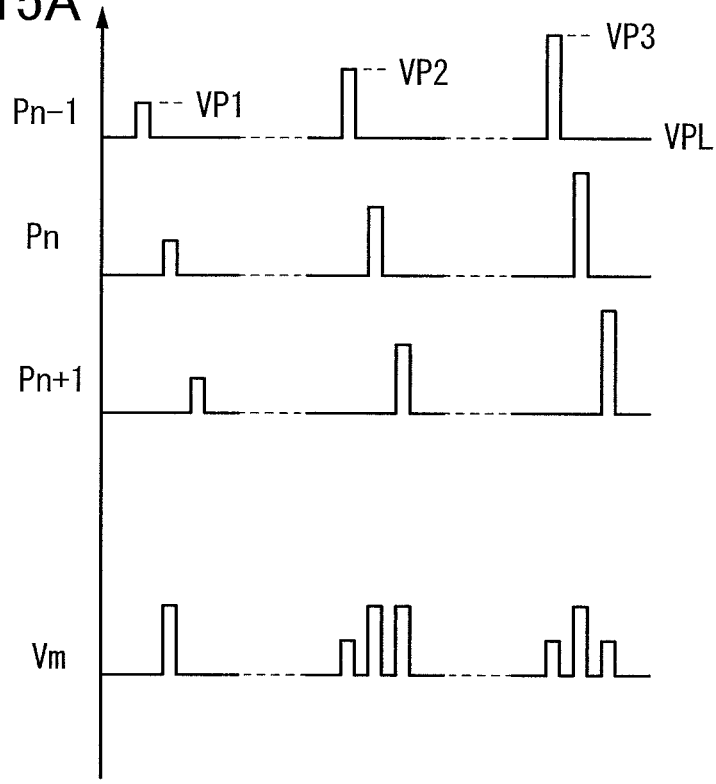
FIGS. 15A and 15B are diagrams illustrating a driving method (reading) of a semiconductor memory device according to Embodiment 6.
Figure 15B:
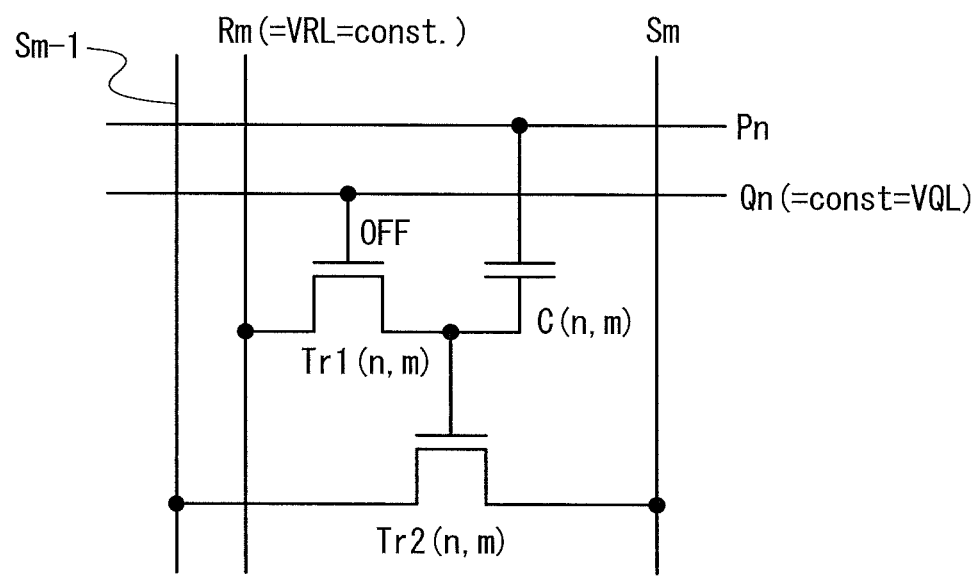

That is, in the case where data shown in Table 1 is input in the memory cells, change in potential, an example of which is illustrated as Vm in FIG. 15A, is observed when pulses illustrated in FIG. 15A are input to the reading word lines Pn−1, Pn, and Pn+1. Here, $V_{PL}$, $V_{P1}$, $V_{P2}$, and $V_{P3}$ correspond to those described with reference to FIG. 4B.

Although the pulses illustrated in FIG. 15A are not uniform in the wave height when compared with the pulses illustrated in FIG. 3A as Om, the number of the pulses illustrated in FIG. 15A is the same as that of the pulses illustrated in FIG. 3A as Om. In other words, similarly to Embodiment 1, the number of pulses corresponding to each memory cell is counted, whereby multivalued data held in the memory cell can be known.

In the above example, the potential of the bias lines in the (m−1)-th column and the columns on the left side of the (m−1)-th column is set to $V_{SH}$ and the potential of the bias lines in the (m+1)-th column and the columns on the right side of the (m+1)-th column is set to $V_{SL}$; however, the potential of the bias lines in the (m−1)-th column and the columns on the left side of the (m−1)-th column may be set to $V_{SL}$ and the potential of the bias lines in the (m+1)-th column and the columns on the right side of the (m+1)-th column may be set to $V_{SH}$.

Embodiment 7

As pointed out in Embodiment 5, there is a problem that power consumption is increased at the time of writing in the driving method of the semiconductor memory device which is described in Embodiment 2. In this embodiment, a driving method in which power consumption is reduced is described.

In this embodiment, during a period other than the time when writing is performed for a selected row, the potential of the reading word line in the row is held at the potential which turns the reading transistor off regardless of the amount of charge on the drain side of the writing transistor. For example, in the case where the reading transistor is an n-channel transistor, the reading word line is held at sufficiently high negative potential. In the case where a value of the amount of the charge held on the drain side of the writing transistor is at any of four stages (Q0, Q1, Q2, and Q3) illustrated in FIG. 4B and the potential of the reading word line is, for example, $V_{PL}$ or lower, the reading transistor is in an off state all the time and thus current does not flow between the source and the drain of the reading transistor.

Specifically, writing is performed as described below. The potential of the bias line Sm keeps to have a constant value, e.g., 0, in the memory cell in the n-th row and the m-th column in FIG. 5A. Further, when data is written, the potential of the reading word line Pn is also set to, for example, 0. When the potential of the writing word line Qn is $V_{QH}$, the writing transistor Tr1(n,m) is turned on. In the case where the writing bit line Rm has any potential, the potential of the gate of the reading transistor Tr2(n,m) is higher than or equal to the threshold value and the reading transistor Tr2(n,m) is turned on, too. Then, in some cases, current flows between the source and the drain of the reading transistor Tr2(n,m) only during a period when data is written in this memory cell.

Next, writing in memory cells in another row is described. Also in that case, the potential of the bias line Sm is 0. On the other hand, a pulse is constantly applied to the writing bit line Rm so that writing is performed in another row. The potential of the writing word line Qn becomes $V_{QL}$ and the writing transistor Tr1(n,m) is in an off state. On the other hand, the potential of the reading word line Pn is set to $V_{PL}$ or lower ($V_{PL}$>$V_{QL}$).

Thus, regardless of the amount of the charge held on the drain side of the writing transistor Tr1(n,m), the reading transistor Tr2(n,m) is in an off state. Therefore, current does not flow between the source and the drain of the reading transistor Tr2(n,m). Note that since the potential applied to the drain of the writing transistor Tr1(n,m) is higher than $V_{QL}$, the writing transistor Tr1(n,m) is not turned on.

In this embodiment, although current flows between the source and the drain of a reading transistor in some cases at the time of writing in the row of the reading transistor, the current flow can be cut at the time of writing in the other rows.

Thus, although more power is consumed in this embodiment than in Embodiment 5, power consumption in this embodiment can be less than that in Embodiment 2 in a relatively easy way.

This application is based on Japanese Patent Application serial no. 2010-012417 filed with Japan Patent Office on Jan. 22, 2010, the entire contents of which are hereby incorporated by reference.

EXPLANATION OF REFERENCE

101: single crystal silicon substrate, 102: element separation region, 103: gate insulating film, 104: dummy gate, 105a: impurity region, 105b: impurity region, 106a: source, 106b: drain, 106c: wiring, 106d: wiring, 107: interlayer insulator, 108: hole portion, 109: contact hole, 110: connection electrode, 110a: electrode, 110b: connection electrode, 111: gate electrode, 111a: electrode, 111b: gate electrode, 112: oxide semiconductor region, 112a: oxide semiconductor film, 113: gate insulating film, 114a: writing word line, 114b: reading word line, 114c: gate electrode, 115a: region exhibiting n-type conductivity, 115b: region exhibiting n-type conductivity, 116: connection electrode, 117: interlayer insulator, 118: wiring, 119: insulating film, 119a: insulating film, 120: capacitor, 150: semiconductor wafer, 151: element separation region, 152: impurity region, 153: floating gate, 154: control gate, 155: insulating film, and 156: insulating film

The invention claimed is:

1. A semiconductor device comprising:
a first line;
a second line;
a third line;
a fourth line; and
a memory cell comprising:
 a first transistor;
 a second transistor; and
 a capacitor,
wherein one of a source and a drain of the first transistor is electrically connected to a gate of the second transistor and one of electrodes of the capacitor,
wherein a gate of the first transistor is electrically connected to the first line,
wherein one of a source and a drain of the second transistor is electrically connected to the third line,
wherein the other of the source and the drain of the second transistor is electrically connected to the fourth line,
wherein the other of electrodes of the capacitor is electrically connected to the second line,
wherein the first transistor comprises a semiconductor layer including an oxide semiconductor,
wherein an area of the capacitor is less than 2 times an area of a channel region of the second transistor,
wherein the semiconductor device is configured to write a plurality of stages of data to the memory cell,
wherein the semiconductor device is configured to read the plurality of stages of data from the memory cell, and
wherein the plurality of stages of data is larger than or equal to three stages of data.

2. The semiconductor device according to claim 1, wherein a width of the second line is greater than or equal to 0.5 times and less than or equal to 1.5 times a channel width of the first transistor.

3. The semiconductor device according to claim 1, wherein leakage current between the source and the drain of the first transistor in an off state is $1\times10^{-20}$ A or smaller at a temperature of 25° C.

4. The semiconductor device according to claim 1, wherein carrier concentration of the oxide semiconductor is less than $1\times10^{14}$ cm$^{-3}$.

5. A semiconductor device comprising:
a first line;
a second line;
a third line;
a fourth line; and
a memory cell comprising:
 a first transistor;
 a second transistor; and
 a capacitor,
wherein one of a source and a drain of the first transistor is electrically connected to a gate of the second transistor and one of electrodes of the capacitor,
wherein a gate of the first transistor is electrically connected to the first line,
wherein one of a source and a drain of the second transistor is electrically connected to the third line,
wherein the other of the source and the drain of the second transistor is electrically connected to the fourth line,
wherein the other of electrodes of the capacitor is electrically connected to the second line,
wherein the first transistor comprises a semiconductor layer including an oxide semiconductor,
wherein the semiconductor device is configured to write a plurality of stages of data to the memory cell,
wherein the semiconductor device is configured to read the plurality of stages of data from the memory cell,
wherein the plurality of stages of data is larger than or equal to three stages of data, and
wherein leakage current between the source and the drain of the first transistor in an off state is $1\times10^{-20}$ A or smaller at a temperature of 25° C.

6. The semiconductor device according to claim 5, wherein carrier concentration of the oxide semiconductor is less than $1\times10^{14}$ cm$^{-3}$.

7. A semiconductor device comprising:
a first line;
a second line;
a third line;
a fourth line; and
a memory cell comprising:
 a first transistor;
 a second transistor; and
 a capacitor,
wherein one of a source and a drain of the first transistor is electrically connected to a gate of the second transistor and one of electrodes of the capacitor,
wherein a gate of the first transistor is electrically connected to the first line,
wherein one of a source and a drain of the second transistor is electrically connected to the third line,
wherein the other of the source and the drain of the second transistor is electrically connected to the fourth line,
wherein the other of electrodes of the capacitor is electrically connected to the second line,
wherein the first transistor comprises a semiconductor layer including an oxide semiconductor,
wherein an area of the capacitor is less than 2 times an area of a channel region of the second transistor,
wherein the semiconductor device is configured to write a plurality of stages of data to the memory cell,
wherein the semiconductor device is configured to read the plurality of stages of data from the memory cell,
wherein the plurality of stages of data is larger than or equal to three stages of data, wherein the semiconductor layer includes a first impurity region and a second impurity region, and wherein the first impurity region and the second impurity region are formed in a self-aligned manner with respect to the gate of the first transistor.

8. The semiconductor device according to claim 7, wherein a width of the second line is greater than or equal to 0.5 times and less than or equal to 1.5 times a channel width of the first transistor.

9. The semiconductor device according to claim 7, wherein leakage current between the source and the drain of the first transistor in an off state is $1\times10^{-20}$ A or smaller at a temperature of 25° C.

10. The semiconductor device according to claim 7, wherein carrier concentration of the oxide semiconductor is less than $1\times10^{14}$ cm$^{-3}$.

* * * * *